(12) United States Patent
Patel et al.

(10) Patent No.: US 9,105,469 B2
(45) Date of Patent: Aug. 11, 2015

(54) DEFECT MITIGATION STRUCTURES FOR SEMICONDUCTOR DEVICES

(75) Inventors: Zubin P. Patel, San Jose, CA (US);
Tracy Helen Fung, Palo Alto, CA (US);
Jinsong Tang, Pleasanton, CA (US);
Wai Lo, Palo Alto, CA (US); Arun Ramamoorthy, Sunnyvale, CA (US)

(73) Assignee: Piquant Research LLC, Wilmington, DE (US)

( * ) Notice: Subject to any disclaimer, the term of this patent is extended or adjusted under 35 U.S.C. 154(b) by 716 days.

(21) Appl. No.: 13/172,880

(22) Filed: Jun. 30, 2011

(65) Prior Publication Data

US 2013/0001641 A1    Jan. 3, 2013

(51) Int. Cl.
*H01L 29/12*     (2006.01)
*H01L 21/02*     (2006.01)

(52) U.S. Cl.
CPC ...... *H01L 21/02433* (2013.01); *H01L 21/0245* (2013.01); *H01L 21/0251* (2013.01); *H01L 21/0254* (2013.01); *H01L 21/02381* (2013.01); *H01L 21/02439* (2013.01); *H01L 21/02447* (2013.01); *H01L 21/02458* (2013.01); *H01L 21/02505* (2013.01)

(58) Field of Classification Search
CPC .............................. H01L 29/26; H01L 29/32
See application file for complete search history.

(56) References Cited

U.S. PATENT DOCUMENTS

| | | | |
|---|---|---|---|
| 6,841,001 B2 | 1/2005 | Saxler | |
| 6,919,585 B2 | 7/2005 | Liu | |
| 7,012,016 B2 | 3/2006 | Gwo et al. | |
| 7,452,757 B2 | 11/2008 | Werkhoven et al. | |
| 7,598,108 B2 * | 10/2009 | Li et al. | 438/48 |
| 7,825,417 B2 | 11/2010 | Sakai et al. | |
| 7,915,147 B2 | 3/2011 | Choi et al. | |
| 2003/0132433 A1 | 7/2003 | Piner et al. | |

(Continued)

FOREIGN PATENT DOCUMENTS

| | | |
|---|---|---|
| JP | 200910142 A | 1/2009 |
| JP | 201118844 A | 1/2011 |
| WO | 0248434 A | 6/2002 |

OTHER PUBLICATIONS

PCT Int'l Search Report & Written Opinion, PCT/US2012/044852, Sep. 19, 2012.

(Continued)

*Primary Examiner* — Wensing Kuo
*Assistant Examiner* — Shaka White

(57) ABSTRACT

A method and a semiconductor device for incorporating defect mitigation structures are provided. The semiconductor device comprises a substrate, a defect mitigation structure comprising a combination of layers of doped or undoped group IV alloys and metal or non-metal nitrides disposed over the substrate, and a device active layer disposed over the defect mitigation structure. The defect mitigation structure is fabricated by depositing one or more defect mitigation layers comprising a substrate nucleation layer disposed over the substrate, a substrate intermediate layer disposed over the substrate nucleation layer, a substrate top layer disposed over the substrate intermediate layer, a device nucleation layer disposed over the substrate top layer, a device intermediate layer disposed over the device nucleation layer, and a device top layer disposed over the device intermediate layer. The substrate intermediate layer and the device intermediate layer comprise a distribution in their compositions along a thickness coordinate.

100 Claims, 10 Drawing Sheets

(56) References Cited

U.S. PATENT DOCUMENTS

| | | |
|---|---|---|
| 2008/0173895 A1 | 7/2008 | Maa et al. |
| 2008/0217645 A1* | 9/2008 | Saxler et al. .................. 257/101 |
| 2008/0296625 A1 | 12/2008 | Li et al. |
| 2009/0001384 A1 | 1/2009 | Kosaki et al. |
| 2010/0055818 A1 | 3/2010 | Chen et al. |
| 2011/0006308 A1 | 1/2011 | Sato |

OTHER PUBLICATIONS

International Preliminary Report on Patentability, PCT/US2012/044852, Jan. 16, 2014.

Korean Intellectual Property Office, Office Action, Feb. 16, 2015, in Korean Pat. Appl. No. 10-2013-7030919.

Japanese Patent Office, Office Action, Mar. 3, 2015, in Japanese Pat. Appl. No. 2014-514939.

* cited by examiner

DEFECT MITIGATION STRUCTURES FOR SEMICONDUCTOR DEVICES

BACKGROUND

Most semiconductor devices made today, including optoelectronic devices such as light emitting devices, solid state lasers, power electronic devices, and on-chip microsystems integrating optical and electronic devices are fabricated using compound semiconductors including, for example, gallium nitride (GaN), gallium arsenide (GaAs), indium phosphide (InP), and related materials. Related materials used in such fabrication include, for example, indium gallium nitride (InGaN), aluminum gallium nitride (AlGaN), Mg-doped GaN, Si-doped GaN, an InAlGaN alloy, indium gallium arsenide (InGaAs), aluminum gallium arsenide (AlGaAs), an InAlGaAs alloy, aluminum indium phosphide (AlInP), aluminum gallium indium phosphide (AlInGaP), and the like. Due to the lack of cost effective, high quality single crystal bulk substrates of the same material, for example, a bulk GaN substrate, an overwhelming majority of these devices use bulk substrates of dissimilar materials such as sapphire ($Al_2O_3$), silicon carbide (SiC), and silicon (Si).

However, differences in crystallographic, thermal and chemical properties between a device and dissimilar substrate material often results in high defect density in the device film that ultimately compromises the performance of the semiconductor device. These defects are frequently in the form of, for example, dislocations, vacancies, substitutions, twins, voids, strain-related three-dimensional (3D) growth islands, and excessive surface roughness due to strain relaxation.

C-axis oriented, epitaxial GaN device films, for example, have been grown on a (111) plane of silicon substrates. As used herein, the (111) plane refers to a plane having indices (111) used in a Miller index notation system in crystallography for orientation of planes in crystal lattices. In the cubic crystal lattice of silicon that is defined by three perpendicular lattice axes, this plane intercepts one unit on each of the lattice axes, that is, a plane formed by three diagonal corner points of the lattice. However, because of the high mismatch in lattice parameter and coefficient of thermal expansion (CTE), as well as due to a chemical reaction between gallium and silicon, an aluminum nitride (AlN) nucleation film on silicon is usually required before the deposition of GaN. Even with the AlN nucleation film, GaN films can still have defect counts as high as $10^9/cm^2$. This high defect count is one of the key issues preventing a wider use of silicon as a substrate for group III nitride semiconductor devices. The adoption of silicon substrates will accelerate the integration of electronic and photonic devices by taking advantage of conventional complementary metal-oxide-semiconductor (CMOS) manufacturing technologies and supply chains. Accordingly, there is a need for overcoming the defectivity issues in group III nitride films on silicon or silicon based substrates.

Hence, there is a long felt but unresolved need for methods and semiconductor devices that incorporate defect mitigation structures for overcoming the defectivity issues related to group III nitride devices on silicon based substrates.

SUMMARY

This summary is provided to introduce a selection of concepts in a simplified form that are further described in the detailed description of the invention. This summary is not intended to identify key or essential inventive concepts of the claimed subject matter, nor is it intended for determining the scope of the claimed subject matter.

The method and the semiconductor device disclosed herein address the above stated needs for incorporating defect mitigation structures that overcome defectivity issues related to group III nitride devices deposited on silicon based substrates. As used herein, the term "defect mitigation structures" refers to semiconductor layers that provide a transition of material properties from a substrate to device layers, a physical location for pinning defects that arise from this transition, and a barrier for preventing propagation of the defects from the substrate to the device layers. The semiconductor device disclosed herein comprises various layers for building, for example, a full light emitting device film stack or a power electronics device film stack. The semiconductor device disclosed herein comprises a substrate, a defect mitigation structure comprising a combination of layers of doped or undoped group IV alloys disposed over the substrate, a metal nitride layer with hexagonal symmetry, and a device active layer disposed over the defect mitigation structure. The substrate is, for example, an off-axis silicon-based substrate and may have dopants or other elements that form an alloy with silicon (Si). In an example, the substrate is a single crystalline silicon based substrate. In other examples, the substrate comprises doped silicon, undoped silicon, a derivative of silicon, and a group IV alloy having a formula $Si_{1-x}Ge_xC_y$, where $0 \leq x \leq 1$ and $0 \leq y \leq 1$. Typical examples of group IV alloys comprise $Si_{0.95}Ge_{0.05}$, silicon carbide (SiC), $Si_{0.95}Ge_{0.05}C_{0.01}$, etc. In an embodiment, for applications in GaN based devices, the substrate is <111> oriented. Also, in order to assist two-dimensional (2D) growth mechanisms and to avoid three dimensional (3D) island-type growth mechanisms of the subsequent films, a proposed macroscopic misorientation angle of the substrate is, for example, greater than about 0° to less than about 10°, or from about 1° to about 5°. This ensures low macroscopic defects such as the number of islands on the films, and a surface roughness of, for example, less than about 10 nm. The substrate has a surface roughness less than 10 nm and is characterized by crystallographic symmetry at an interfacing region with a substrate nucleation layer. The device active layer comprises a group III nitride material, for example, a gallium nitride (GaN) based material.

The method and the semiconductor device disclosed herein further comprise epitaxial films grown on top of the silicon based substrate for trapping defects. These epitaxial films constituting the defect mitigation structure can be grown, for example, by chemical vapor deposition (CVD), or a similar process at temperatures ranging from, for example, about 350° C. to about 1100° C. In an embodiment, the defect mitigation structure comprises sub-layer structures of different compositions, thicknesses, physical properties, and chemical properties that form a complete entity with a defect contentment function. For example, the defect mitigation structure comprises one or more defect mitigation layers comprising a substrate nucleation layer disposed over the substrate, a substrate intermediate layer disposed over the substrate nucleation layer, a substrate top layer disposed over the substrate intermediate layer, a device nucleation layer disposed over the substrate top layer, a device intermediate layer disposed over the device nucleation layer, and a device top layer disposed over the device intermediate layer. In an example, these defect mitigation layers can be a combination of layers comprising doped or undoped group IV alloys of the form $Si_{1-x}Ge_xC_y$, where $0 \leq x \leq 1$ and $0 \leq y \leq 1$. In another example, the defect mitigation layers also comprise doped or undoped metal nitrides, non-metal nitrides, group III nitrides, and derivatives of these materials. Furthermore, the defect mitigation layers are grown such that the defects generated due to the material mismatch are trapped in a layer of varying alloy composition, in order that a layer of constant alloy composition grown over the layer of varying alloy composition has a low defect density.

The substrate intermediate layer is compositionally distributed along a thickness coordinate. In an embodiment, the distribution in composition of the substrate intermediate layer is based on a distribution of a single ingredient in the substrate intermediate layer composition. The distribution of the single ingredient in the substrate intermediate layer comprises an arbitrary number of both variable composition regions and constant composition regions of uncorrelated thicknesses. Furthermore, the distribution of the single ingredient in each of the variable composition regions of the substrate intermediate layer changes abruptly, at an increasing rate, at a uniform rate, or at a decreasing rate. In another embodiment, the distribution in the composition of the substrate intermediate layer is based on the distribution of more than one ingredient in the substrate intermediate layer composition. The distribution of the ingredients in the substrate intermediate layer comprises an arbitrary number and positions of both variable composition regions and constant composition regions of uncorrelated thicknesses. Furthermore, the distribution of the ingredients in each of the variable composition regions of the substrate intermediate layer changes abruptly, at an increasing rate, at a uniform rate, or at a decreasing rate.

The device intermediate layer is compositionally distributed along a thickness coordinate. In an embodiment, the distribution in the composition of the device intermediate layer is based on a distribution of a single ingredient in the device intermediate layer composition. The distribution of the single ingredient in the device intermediate layer comprises an arbitrary number of both variable composition regions and constant composition regions of uncorrelated thicknesses. Furthermore, the distribution of the single ingredient in each of the variable composition regions of the device intermediate layer changes abruptly, at an increasing rate, at a uniform rate, or at a decreasing rate. In another embodiment, the distribution in the composition of the device intermediate layer is based on a distribution of more than one ingredient in the device intermediate layer composition. The distribution of the ingredients in the device intermediate layer comprises an arbitrary number and positions of both variable composition regions and constant composition regions of uncorrelated thicknesses. Furthermore, the distribution of the ingredients in each of the variable composition regions of the device intermediate layer changes abruptly, at an increasing rate, at a uniform rate, or at a decreasing rate.

The substrate intermediate layer comprises, for example, a group IV alloy having a formula $Si_{1-x}Ge_xC_y$, where $0 \leq x \leq 1$ and $0 \leq y \leq 1$. The device nucleation layer is composed of, for example, metal or non-metal nitride compounds and alloys with lattice hexagonal symmetry or hexagonal symmetry on one of their planes. The device nucleation layer comprises, for example, silicon nitride ($Si_3N_4$), $(Si_{1-x}Ge_x)_3N_4$, $Ge_3N_4$, aluminum nitride (AlN), titanium nitride (TiN), aluminum indium nitride (AlInN), or derivatives thereof. The device intermediate layer is composed of metal nitride compounds and alloys with lattice hexagonal symmetry or hexagonal symmetry on one of their planes. The device intermediate layer comprises, for example, one or more of aluminum nitride (AlN), titanium nitride (TiN), aluminum indium nitride (AlInN), aluminum gallium nitride (AlGaN), AlInGaN, Si—AlN, Si—AlInN, Si—GaN, Si—AlGaN, Si—AlInGaN, Mg—AlN, Mg—AlInN, Mg—GaN, Mg—AlGaN, Mg—AlInGaN, Ge—AlN, Ge—AlInN, Ge—GaN, Ge—AlGaN, Ge—AlInGaN, and derivatives thereof.

In an embodiment, one or more properties of the substrate nucleation layer are substantially similar to one or more properties of the substrate. A few of the properties of the layers comprise, for example, lattice structure, lattice parameters, chemical reactivity, coefficient of thermal expansion (CTE), thermal conductivity, electrical conductivity, etc. The substrate nucleation layer is either a doped substrate nucleation layer or an undoped substrate nucleation layer. The dopant for doping the substrate nucleation layer is, for example, one of boron (B), aluminum (Al), phosphorous (P), arsenic (As), etc. The thickness of the substrate nucleation layer ranges from, for example, about 10 nm to about 1000 nm. The substrate nucleation layer is further characterized by either a substantially similar defect density compared to the substrate or a lower defect density compared to the substrate.

The substrate intermediate layer is either a doped substrate intermediate layer or an undoped substrate intermediate layer. The thickness of the substrate intermediate layer ranges from, for example, about 1000 nm to 5000 nm. The dopant for doping the substrate intermediate layer is, for example, one of boron, aluminum, phosphorous, arsenic, etc. In an embodiment, one or more properties of the substrate intermediate layer are different from one or more properties of the substrate nucleation layer. In another embodiment, the composition of the substrate top layer is substantially similar to a top surface of the substrate intermediate layer. The substrate top layer is characterized by a lower defect density compared to the substrate intermediate layer. The substrate top layer is either a doped substrate top layer or an undoped substrate top layer. The dopant for doping the substrate top layer is, for example, one of boron, aluminum, phosphorous, arsenic, etc. The thickness of the substrate top layer ranges from, for example, about 200 nm to about 2000 nm.

In an embodiment, one or more properties of the device nucleation layer are substantially similar to one or more properties of the substrate top layer. In another embodiment, one or more properties of the device nucleation layer are different from one or more properties of the substrate top layer. The device nucleation layer is characterized by either a high defect density or a low defect density. The thickness of the device nucleation layer ranges from, for example, about 10 nm to about 500 nm. In an embodiment, the lattice parameters of the device intermediate layer are substantially similar to the lattice parameters of the device nucleation layer, while a coefficient of thermal expansion (CTE) of the device intermediate layer is different from a coefficient of thermal expansion (CTE) of the device nucleation layer. The device intermediate layer is characterized by a lower defect density compared to the device nucleation layer. The thickness of the device intermediate layer ranges from, for example, about 100 nm to 4000 nm. The composition of the device top layer matches the composition of the device active layer. The lattice parameters and the coefficient of thermal expansion of the device top layer are different from the lattice parameters and the coefficient of thermal expansion of the device intermediate layer. The thickness of the device top layer ranges from, for example, about 100 nm to about 1000 nm.

In an embodiment where the device active layer comprises gallium nitride (GaN), a metal nitride layer with hexagonal symmetry is deposited on the top of the substrate defect mitigation layers to form the device nucleation layer to grow the device intermediate layer and the device active layer. The defect mitigation layers comprise a device top layer composed of GaN. The device nucleation layer is, for example, composed of a metal nitride material with either a hexagonal lattice structure such as aluminum nitride (AlN), aluminum gallium nitride (AlGaN), Si—AlN, Si—AlGaN, Ge—AlN, Ge—AlGaN, Mg—AlN, Mg—AlGaN, Ge—AlN, and Ge—AlGaN, or with a hexagonal symmetry on one of its lattice planes such as the (111) plane of the body-centered cubic titanium nitride (TiN). In crystallography, a crystal lattice or a crystal plane is said to have a hexagonal symmetry or a hexagonal structure, if all the atoms in the lattice or on the lattice plane fit into the lattice sites of the same type of atoms after a 60-degree rotation about an axis perpendicular to the lattice or plane of symmetry.

Also, disclosed herein is a method for fabricating a semiconductor device having a defect mitigation structure. A <111> oriented substrate based on silicon is provided. A defect mitigation structure is disposed over the substrate. A device active layer is disposed over the defect mitigation structure. In an embodiment, the defect mitigation structure is fabricated by depositing one or more defect mitigation layers on the substrate. The defect mitigation structure comprises a substrate nucleation layer disposed over the substrate, a substrate intermediate layer disposed over the substrate nucleation layer, a substrate top layer disposed over the substrate intermediate layer, a device nucleation layer disposed over the substrate top layer, a device intermediate layer disposed over the device nucleation layer, and a device top layer disposed over the device intermediate layer.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and components disclosed herein.

DETAILED DESCRIPTION OF EMBODIMENTS

Figure 1:
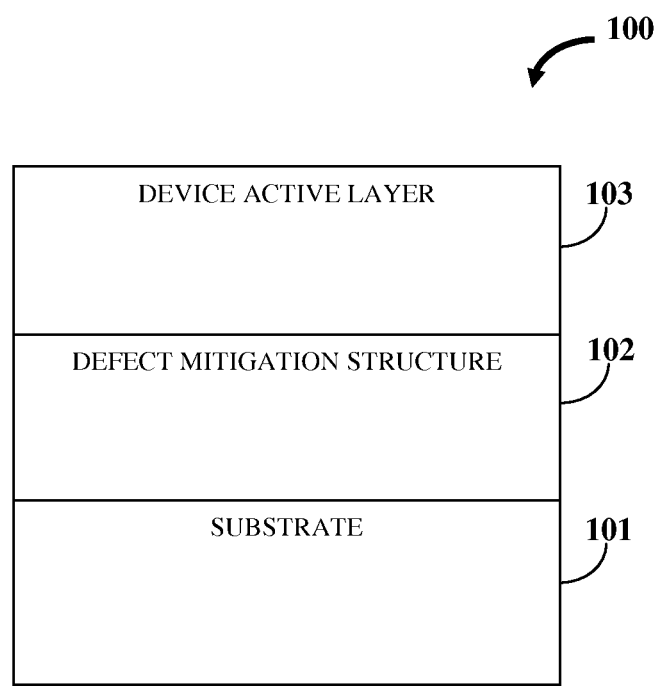
FIG. 1 exemplarily illustrates a general architecture of a semiconductor device comprising a defect mitigation structure.

FIG. 1 exemplarily illustrates a general architecture of a semiconductor device 100 comprising a defect mitigation structure 102. The semiconductor device 100 disclosed herein comprises a substrate 101, the defect mitigation structure 102, and a device active layer 103. The defect mitigation structure 102 or layer is deposited on the substrate 101 prior to deposition of the device active layer 103. Both the defect mitigation structure 102 and the device active layer 103 are grown epitaxially on the substrate 101. In an embodiment, the device active layer 103 has low defect densities, whereas the defect mitigation structure 102 has high defect densities. The crystallographic symmetry at the substrate 101—defect mitigation structure 102 interface and the defect mitigation structure 102—device active layer 103 interface are substantially similar. However, the lattice parameters and the coefficient of thermal expansion (CTE) between these three layers 101, 102, and 103 may be different.

The substrate 101 is an off-axis silicon based substrate 101 and may have dopants or other elements that form an alloy with Si. In an example, the substrate 101 is a single crystalline silicon based substrate. The substrate 101 comprises, for example, doped silicon, undoped silicon, a derivative of silicon, or a group IV alloy having a formula $Si_{1-x}Ge_xC_y$, where $0 \le x \le 1$ and $0 \le y \le 1$. Typical examples of group IV alloys comprise $Si_{0.95}Ge_{0.05}$, silicon carbide (SiC), $Si_{0.95}Ge_{0.05}C_{0.01}$, etc. In an embodiment, for applications in gallium nitride (GaN) based devices, the substrate 101 is <111> oriented. Also, in order to assist two-dimensional (2D) growth mechanisms, for example, Van der Merwe growth mechanisms, and to avoid three dimensional (3D) island-type growth mechanisms, for example, Stranski-Krastanov growth mechanisms of the subsequent films, the macroscopic misorientation angle of the substrate 101 is, for example, greater than about 0° to less than about 10°, or from about 1° to about 5°. This ensures low macroscopic defects, for example, the number of islands on the films, and a surface roughness of about less than 10 nm. The substrate 101 has a roughness of less than 10 nm and is characterized by crystallographic symmetry at an interface region with a substrate nucleation layer 102a of the defect mitigation structure 102 as exemplarily illustrated in FIG. 2. The defect mitigation structure 102 comprises defect mitigation layers 102a, 102b, 102c, 102d, 102e, and 102f as disclosed in the detailed description of FIG. 2. The device active layer 103 disposed over the defect mitigation structure 102 comprises, for example, a group III nitride material.

Figure 2:
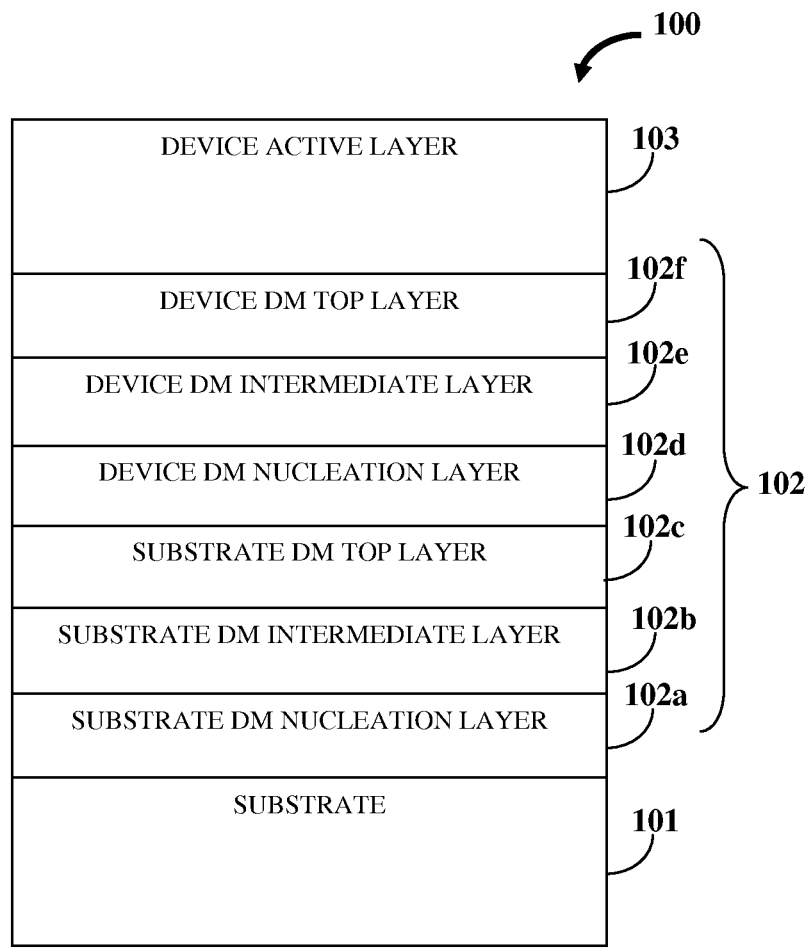
FIG. 2 exemplarily illustrates defect mitigation layers of the defect mitigation structure.

FIG. 2 exemplarily illustrates the defect mitigation layers 102a, 102b, 102c, 102d, 102e, and 102f of the defect mitigation structure 102. The defect mitigation structure 102 comprises a substrate defect mitigation (DM) nucleation layer 102a herein referred to as a substrate nucleation layer 102a, a substrate DM intermediate layer 102b herein referred to as a substrate intermediate layer 102b, a substrate DM top layer 102c herein referred to as a substrate top layer 102c, a device DM nucleation layer 102d herein referred to as a device nucleation layer 102d, a device DM intermediate layer 102e herein referred to as a device intermediate layer 102e, and a device DM top layer 102f herein referred to as a device top layer 102f. These defect mitigation layers 102a, 102b, 102c, 102d, 102e, and 102f are grown epitaxially on the substrate 101.

The substrate nucleation layer 102a, the substrate intermediate layer 102b, and the substrate top layer 102c, also referred to as the substrate defect mitigation layers 102a, 102b, and 102c, can be epitaxially grown using chemical vapor deposition techniques in a temperature range of, for example, about 500° C. to about 1300° C., depending on their compositions. The device nucleation layer 102d, the device intermediate layer 102e, and the device top layer 102f, also referred to as the device defect mitigation layers 102d, 102e, and 102f, can be epitaxially grown using metallorganic chemical vapor deposition or sputtering techniques in the temperature range of, for example, about 500° C. to about 1200° C. Since the growth techniques between the substrate defect mitigation layers 102a, 102b, and 102c and the device defect mitigation layers 102d, 102e, and 102f are different, they have to be grown using different processes as disclosed in the detailed description of FIGS. 8A-8B, which typically involves a cleaning step between these growth processes.

One or more properties of the substrate nucleation layer 102a are substantially similar to one or more properties of the substrate 101. For example, the substrate nucleation layer 102a may have the same composition, lattice parameters, and coefficient of thermal expansion (CTE) as the substrate 101, and typically has a substantially similar defect density or a lower defect density compared to the substrate 101. The substrate nucleation layer 102a is provided to extend the material features of the substrate 101 while providing a conditioned surface for growing the subsequent epitaxial layers 102b, 102c, etc. For example, the substrate nucleation layer 102a is composed of silicon when the substrate 101 used is silicon. The substrate nucleation layer 102a may also be undoped, that is, with low electrical conductivity, or doped to achieve high electrical conductivity and probably a high thermal conductivity. Typical dopants for the substrate nucleation layer 102a comprise, for example, boron (B), aluminum (Al), phosphorous (P), arsenic (As), etc. The thickness range of the substrate nucleation layer 102a is, for example, from about 10 nm to about 1000 nm, or for example, from about 100 nm to about 500 nm.

One or more properties of the substrate intermediate layer 102b are different from one or more properties of the substrate nucleation layer 102a. For example, the substrate intermediate layer 102b may have lattice parameters and coefficient of thermal expansion (CTE) different from the substrate nucleation layer 102a, and varying composition and defect density throughout its thickness. Typically, the substrate intermediate layer 102b is characterized by a higher defect density than the substrate nucleation layer 102a. The substrate intermediate layer 102b may also have sub-structures. Considering a silicon (Si) substrate 101 as an example, the substrate nucleation layer 102a comprises Si and the substrate intermediate layer 102b is selected from the group IV alloy material system having the formula $Si_{1-x}Ge_xC_y$ with $0 \leq x \leq 1$ and $0 \leq y \leq 1$. The substrate intermediate layer 102b may also be undoped to provide low electrical conductivity, or doped to achieve high electrical conductivity and probably high thermal conductivity. Typical dopants for the substrate intermediate layer 102b comprise, for example, boron (B), aluminum (Al), phosphorus (P), arsenic (As), etc. The typical thickness range of the substrate intermediate layer 102b is, for example, from about 1000 nm to about 5000 nm, or for example, from about 2000 nm to about 4000 nm. The substrate intermediate layer 102b provides a transition of the properties, for example, lattice parameters between the substrate nucleation layer 102a and the substrate top layer 102c, provides defect contentment to trap defects, for example, dislocations, and prevents them from propagating to the substrate top layer 102c.

A composition of the substrate top layer 102c is substantially similar to a composition of a top surface of the substrate intermediate layer 102b. In an embodiment, the substrate top layer 102c has the same composition, lattice parameters, and coefficient of thermal expansion (CTE) as the surface of the substrate intermediate layer 102b. The substrate top layer 102c is typically characterized by a lower defect density compared to that in the substrate intermediate layer 102b. In an example where the substrate intermediate layer 102b is selected from the group IV alloy material system $Si_{1-x}Ge_xC_y$, where x=x1 and y=y1, the composition of the substrate top layer 102c is, for example, $Si_{1-x1}Ge_{x1}C_{y1}$. The substrate top layer 102c may also be undoped to provide low electrical conductivity, or doped to achieve high electrical conductivity and probably high thermal conductivity. Typical dopants for the substrate top layer 102c comprise, for example, boron (B), aluminum (Al), phosphorous (P), arsenic (As), etc. The typical thickness range of the substrate top layer 102c is, for example, from about 200 nm to about 2000 nm, or from about 300 nm to about 1000 nm.

In an embodiment, one or more properties of the device nucleation layer 102d are substantially similar to one or more properties of the substrate top layer 102c. In another embodiment, one or more properties of the device nucleation layer 102d are different from one or more properties of the substrate top layer 102c. For example, the device nucleation layer 102d has lattice parameters similar to the substrate top layer 102c, but has a coefficient of thermal expansion (CTE) different from the substrate top layer 102c. The device nucleation layer 102d provides a transition between the material systems of the substrate defect mitigation layers 102a, 102b, and 102c composed of group IV alloys and the device defect mitigation layers 102d, 102e, and 102f, which are nitride-based. The device nucleation layer 102d also minimizes chemical reactions between the substrate defect mitigation layers 102a, 102b, and 102c and the device defect mitigation layers 102d, 102e, and 102f.

The device nucleation layer 102d and the substrate top layer 102c may be composed of the same or different material systems. There may also be atomic mixing such as inter-diffusion of the device nucleation layer 102d with the substrate top layer 102c. The device nucleation layer 102d may be characterized by a high defect density of the order of, for example, about $1 \times 10^{10}/cm^2$, or a low defect density of the order of, for example, about $1 \times 10^8/cm^2$, depending on the materials of choice and process conditions. For applications in group III nitride devices, the device nucleation layer 102d comprises, for example, metal nitrides and non-metal nitrides with hexagonal crystal symmetry such as AlN, $Si_3N_4$, $Ge_3N_4$, etc., or hexagonal symmetry on one of their lattice planes, for example, $(Si_{1-x}Ge_x)_3N_4$, TiN, etc. The typical thickness of the device nucleation layer 102d is, for example, from about 10 nm to about 500 nm, or for example, from about 20 nm to about 300 nm.

The device intermediate layer 102e has lattice parameters substantially similar to those of the device nucleation layer 102d, but may have a coefficient of thermal expansion (CTE) different from the device nucleation layer 102d. The device nucleation layer 102d and the device intermediate layer 102e may be from the same or different material systems. The device intermediate layer 102e typically has defect densities lower than the device nucleation layer 102d. The device intermediate layer 102e may also have sub-structures. For example, in the case of gallium nitride (GaN) devices, the device intermediate layer 102e comprises AlN, TiN, AlGaN, AlInGaN, Si—AlGaN, etc. The typical thickness range of the device intermediate layer 102e is, for example, from about 100 nm to about 4000 nm, or for example, from about 200 nm to about 2000 nm.

The device top layer 102f has lattice parameters and a coefficient of thermal expansion (CTE) different from those of the device intermediate layer 102e. The device top layer 102f may be composed of the same material as the device nucleation layer 102d, which is the first device defect mitigation layer 102d. Hence, the device top layer 102f and the device intermediate layer 102e may be from different material systems. As an example, the device top layer 102f should be GaN if the device is GaN-based. The typical thickness range of the device top layer 102f is, for example, from about 100 nm to about 1000 nm, or for example, from about 200 nm to about 500 nm. In an embodiment, a composition of the device top layer 102f matches a composition of the device active layer 103.

Figure 3:
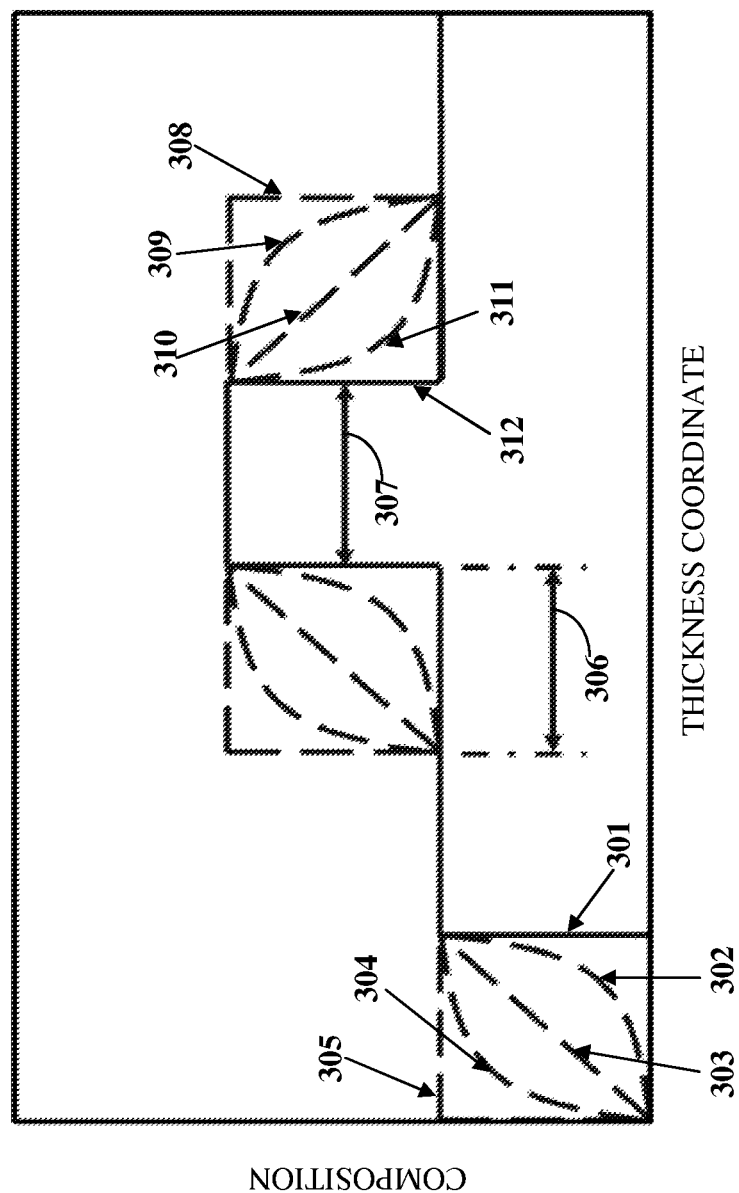
FIG. 3 illustrates exemplary profiles of the distribution in the composition of the substrate intermediate layer of the defect mitigation structure.

FIG. 3 illustrates exemplary profiles of the distribution in the composition of the substrate intermediate layer 102b of the defect mitigation structure 102. FIG. 3 shows a distribution in the substrate intermediate layer composition along a thickness coordinate. The distribution in the composition of the substrate intermediate layer 102b may be based on the distribution of one of the ingredients in the group IV alloy, for example, x or y in $Si_{1-x}Ge_xC_y$, or a dopant, for example, boron (B), aluminum (Al), phosphorus (P), arsenic (As), etc. Typically, the composition distribution has a variable composition region 306 and a constant composition region 307. The actual number of variable-constant composition pairs 306 and 307 may be different. For example, the distribution in the composition of the substrate intermediate layer 102b comprises one variable-constant composition pair 306 and 307, or 5 variable-constant composition pairs 306 and 307. FIG. 3 shows three variable-constant composition pairs, although only one such pair—the pair in the middle—is labeled with the reference numbers 306 and 307. The thickness of each region 306 or 307 can vary independently. The total number of the variable-constant composition pairs 306 and 307 can also vary independently. In an example, in a first pair of variable-constant composition regions 306 and 307, each has a thickness of about 100 nm and about 200 nm respectively; in the second pair of variable-constant composition regions 306 and 307, each has a thickness of about 200 nm and about 0 nm respectively; and in the third pair of variable-constant composition regions 306 and 307, each has a thickness of about 150 nm and about 50 nm respectively, and so on.

The compositions of the various constant composition regions 307 may not be correlated. For example, a first constant composition region 307 has about 1% of the dopant boron (B), the second constant composition region 307 has about 2% boron (B), and the third constant composition region 307 has about 0.5% boron (B), and so on. In an embodiment, the method and the semiconductor device 100 disclosed herein employ different schemes for altering the composition in the variable composition regions 306. Label 301 depicts a scheme in which the composition remains constant for a certain thickness, for example, for the width of the region 306, and increases abruptly to another constant composition value. Label 302 depicts a scheme where the composition is raised at an increasing or exponential rate until the composition reaches a constant value. Label 303 depicts a scheme where the composition increases linearly to a constant value. Label 304 represents a scheme where the composition increases at a diminishing rate until the composition reaches a constant value. Label 305 shows a scheme where the composition jumps abruptly to a constant value. These schemes 301, 302, 303, 304, and 305 for composition changes in each variable-constant composition pair 306 and 307 are independent. For example, the first variable composition region 306 follows the scheme 301, the second variable composition region 306 follows the scheme 302, and the third variable composition region 306 follows the scheme 303, and so on.

The techniques for targeting the distribution of the compositions in the variable composition regions 306 of the substrate intermediate layer 102b comprise, for example, controlling the ratio of the precursors used for growing the variable composition regions 306, the hardware configuration of the growth chambers, as well as the film growth conditions, for example, temperature and pressure. For example, in order to achieve an abrupt change in the composition, a mass flow controller (MFC) that controls the flow rate of a particular component of the composition to be altered can be closed or opened abruptly. Similarly, in order to achieve a continuous increase in the composition value, either at a constant rate or changing rates, the mass flow controller can be opened or closed gradually in a pre-programmed fashion.

In another embodiment, the method and the semiconductor device 100 disclosed herein employ different schemes in which the composition value of the substrate intermediate layer 102b decreases in the variable composition region 306. Label 308 depicts a scheme in which the composition remains constant for a certain thickness, for example, for the width 306 and decreases abruptly to another constant composition value. Label 309 shows a scheme where the composition is reduced at an increasing rate until the composition reaches a constant value. Label 310 shows a scheme where the composition decreases linearly to a constant value. Label 311 shows a scheme where the composition decreases at a diminishing rate until the composition reaches a constant value. Label 312 shows a scheme where the composition drops abruptly to a constant value. The techniques for targeting the distribution of the compositions in the variable composition regions 306 of the substrate intermediate layer 102b comprise, for example, controlling the ratio of precursors used for growing the variable composition regions 306, the hardware configuration of the growth chambers, as well as the film growth conditions, for example, temperature and pressure. For example, in order to achieve an abrupt change in the composition, the mass flow controller (MFC) that controls the flow rate of a particular component of the composition to be altered can be closed or opened abruptly. Similarly, in order to achieve a continuous decrease in the composition value, either at a constant rate or changing rates, the mass flow controller can be opened or closed gradually in a pre-programmed fashion.

Typically, each constant composition region 307 has constant physical parameters, for example, lattice parameters, coefficient of thermal expansion (CTE), thermal conductivity, and electrical conductivity. However, each variable composition region 306 has at least one of these parameters changing across the thickness of that variable composition region 306. The extent of changes in the physical parameters in the variable composition regions 306 is not correlated. Typically, the defect density in the variable composition regions 306 is higher than the defect density in the constant composition regions 307.

Figure 4:
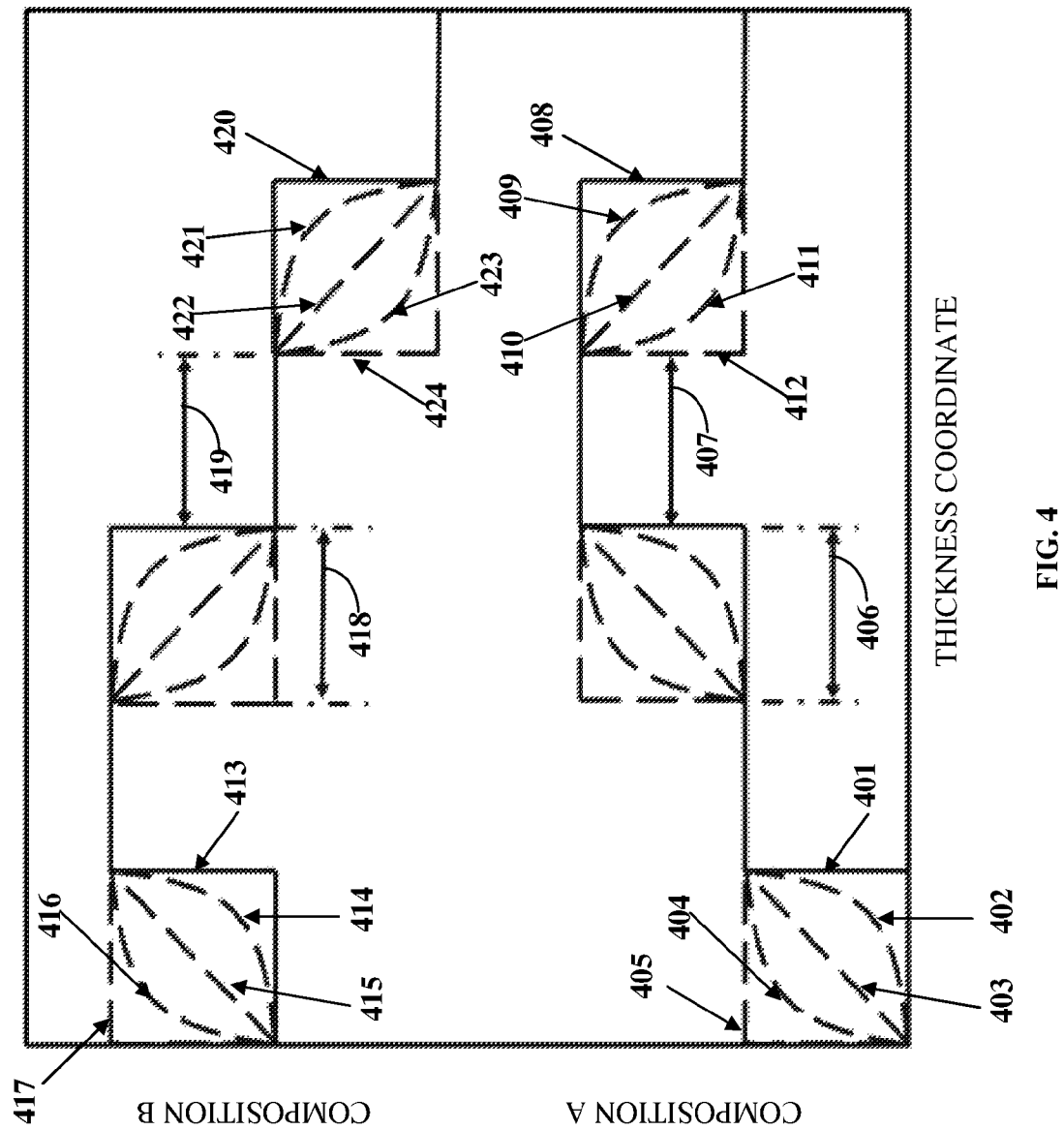
FIG. 4 illustrates exemplary profiles of the distribution in the composition of the substrate intermediate layer of the defect mitigation structure, where the distribution in the substrate intermediate layer composition is based on the distribution of more than one ingredient in the substrate intermediate layer composition.

FIG. 4 illustrates exemplary profiles of the distribution in the composition of the substrate intermediate layer 102b of the defect mitigation structure 102, where the distribution in the substrate intermediate layer composition is based on the distribution of more than one ingredient in the substrate intermediate layer composition. In this embodiment, the distribution in the composition of the substrate intermediate layer 102b is based on a distribution of more than one ingredient in a group IV alloy from the bottom to the top. As an illustrative example, composition A in FIG. 4 is based on the distribution of arsenic (As), and composition B is based on "x" in an $As—Si_{1-x}Ge_xC_y$ alloy. Composition A typically has a variable composition region 406 and a constant composition region 407. The actual number of variable-constant composition pairs 406 and 407 may be different. For example, the composition distribution comprises one variable-constant composition pair 406 and 407 or 5 variable-constant composition pairs 406 and 407. FIG. 4 shows three variable-constant composition pairs for composition A, although only one such pair—the pair in the middle—is labeled with the reference numbers 406 and 407. The thickness of each region, for example, 406 or 407 can vary independently. The total number of the variable-constant composition pairs 406 and 407 can also vary independently. As an example, in the first pair of variable-constant composition regions 406 and 407, each has a thickness of about 100 nm and about 200 nm respectively; in the second pair of variable-constant composition regions 406 and 407, each has a thickness of about 200 nm and about 0 nm respectively; and in the third pair of variable-constant composition regions 406 and 407, each has a thickness of about 150 nm and about 50 nm respectively, and so on.

The compositions of the various constant composition regions 407 may not be correlated. For example, the first constant composition region 407 has about 1% of the dopant arsenic (As), the second constant composition region 407 has about 2% arsenic (As), and the third constant composition region 407 has about 0.9% arsenic (As), and so on. In an embodiment, the method and the semiconductor device 100 disclosed herein employ different schemes for increasing the composition in the variable composition region 406 of composition A. Label 401 depicts a scheme in which the composition remains constant for a certain thickness, for example, for the width of 406 and increases abruptly to another constant composition value. Label 402 shows a scheme where the composition is raised at an increasing or exponential rate until the composition reaches a constant value. Label 403 shows a scheme where the composition increases linearly to a constant value. Label 404 shows a scheme where the composition increases at a diminishing rate until the composition reaches a constant value. Label 405 shows a scheme where the composition jumps abruptly to a constant value.

In another embodiment, the method and the semiconductor device 100 disclosed herein employ different schemes by which the composition value of the substrate intermediate layer 102b decreases in the variable composition region 406 of composition A. Label 408 depicts a scheme in which the composition remains constant for a certain thickness, for example, for the width of 406 and decreases abruptly to another constant composition value. Label 409 shows a scheme where the composition is reduced at an increasing rate until the composition reaches a constant value. Label 410 shows a scheme where the composition decreases linearly to a constant value. Label 411 shows a scheme where the composition decreases at a diminishing rate until the composition reaches a constant value. Label 412 shows a scheme where the composition drops abruptly to a constant value. The schemes, for example, 401, 402, 403, 404, 405, 408, 409, 410, 411, and 412 of composition changes in each variable-constant composition pair 406 and 407 of composition A are independent. For example, the first variable composition region 406 follows the scheme 401, the second variable composition region 406 has the scheme 403, and the third variable composition region 406 has the scheme 411, and so on.

Similar to composition A, composition B typically has a variable composition region 418 and a constant composition region 419. The number of variable-constant composition pairs 418 and 419 may be different. For example, the composition distribution comprises one variable-constant composition pair 418 and 419 or 5 variable-constant composition pairs 418 and 419. FIG. 4 shows three variable-constant composition pairs for composition B, although only one such pair—the pair in the middle—is labeled with the reference numbers 418 and 419. The thickness of each region, for example, 418 or 419 can vary independently. The total number of the variable-constant composition pairs 418 and 419 can also vary independently. As an example, in the first pair of variable-constant composition regions 418 and 419, each has a thickness of about 100 nm and about 200 nm respectively; in the second pair variable-constant composition regions 418 and 419, each has a thickness of about 200 nm and 0 nm respectively; and in the third pair of variable-constant composition regions 418 and 419, each has a thickness of about 150 nm and about 50 nm respectively, and so on.

The compositions of the various constant composition regions 419 may not be correlated. For example, if the substrate intermediate layer 102b is based on $Si_{1-x}Ge_xC_y$, the first constant composition region 419 has x=0.3, the second constant composition region 419 has x=0.15, and the third constant composition region 419 has x=0.05, and so on. In an embodiment, the method and the semiconductor device 100 disclosed herein employ different schemes by which the composition increases in the variable composition region 418 of composition B. For example, label 413 depicts a scheme in which the composition remains constant for a certain thickness, for example, for the width of 418 and increases abruptly to another constant composition value. Label 414 shows a scheme where the composition is raised at an increasing or exponential rate until the composition reaches a constant value. Label 415 shows a scheme where the composition increases linearly to a constant value. Label 416 shows a scheme where the composition increases at a diminishing rate until the composition reaches a constant value. Label 417 shows a scheme where the composition jumps abruptly to a constant value.

In another embodiment, the method and the semiconductor device 100 disclosed herein employ different schemes by which the composition value of the substrate intermediate layer 102b decreases in the variable composition region 418 of composition B. For example, label 420 depicts a scheme in which the composition remains constant for a certain thickness, for example, for the width of 418 and decreases abruptly to another constant composition value. Label 421 shows a scheme where the composition is reduced at an increasing rate until the composition reaches a constant value. Label 422 shows a scheme where the composition decreases linearly to a constant value. Label 423 shows a scheme where the composition decreases at a diminishing rate until the composition reaches a constant value. Label 424 shows a scheme where the composition drops abruptly to a constant value. The schemes, for example, 413, 414, 415, 416, 417, 420, 421, 422, 423, and 424 of composition changes in each set of variable-constant composition pairs 418 and 419 of composition B are independent. For example, the first variable composition region 418 follows the scheme 413, the second variable composition region 418 follows the scheme 421, and the third variable composition region 418 follows the scheme 424, and so on.

The changes in compositions of A and B may or may not be correlated. Consider, for example, that composition A is based on the distribution of arsenic (As), and composition B is based on "x" in an $As—Si_{1-x}Ge_xC_y$ alloy. In this example, the distributions of arsenic (As) and x are fully independent. However, in cases where composition A represents "y", that is, the concentration of carbon in the alloy, a change in "x" affects the maximum solubility of carbon, and hence imposes an upper limit to the value of "y". Also, the regions where changes in composition A and composition B occur may or may not be correlated. For example, composition A varies in a certain region while composition B remains a constant in that region, and vice versa in another region. The thickness of each set of variable-constant composition pairs 406, 407 and 418, 419 in composition A and composition B respectively may or may not be the same. For example, the first variable composition region 406 in composition A has a thickness of about 200 nm, whereas the first variable composition region 418 in composition B has a thickness of about 50 nm, even if the compositions have any overlap in the regions 406 and 418.

Typically, physical parameters, for example, lattice parameters, coefficient of thermal expansion (CTE), thermal conductivity, and electrical conductivity of a layer may change when at least one of the compositional elements is varied, and these parameters remain constant only when the compositional elements of a layer remain unchanged. Typically, each constant composition region 407 or 419 has constant physical parameters, for example, lattice parameters, CTE, thermal conductivity, and electrical conductivity. However, each variable composition region 406 or 418 has at least one of these parameters changing across the thickness of that variable composition region 406 or 418. The degree of change in the physical parameters in the variable composition regions 406 and 418 is not correlated. Typically, the defect density is high in any region where either composition A or composition B is changed, and the defect density is low in regions where both composition A and composition B remain constant.

Figure 5:
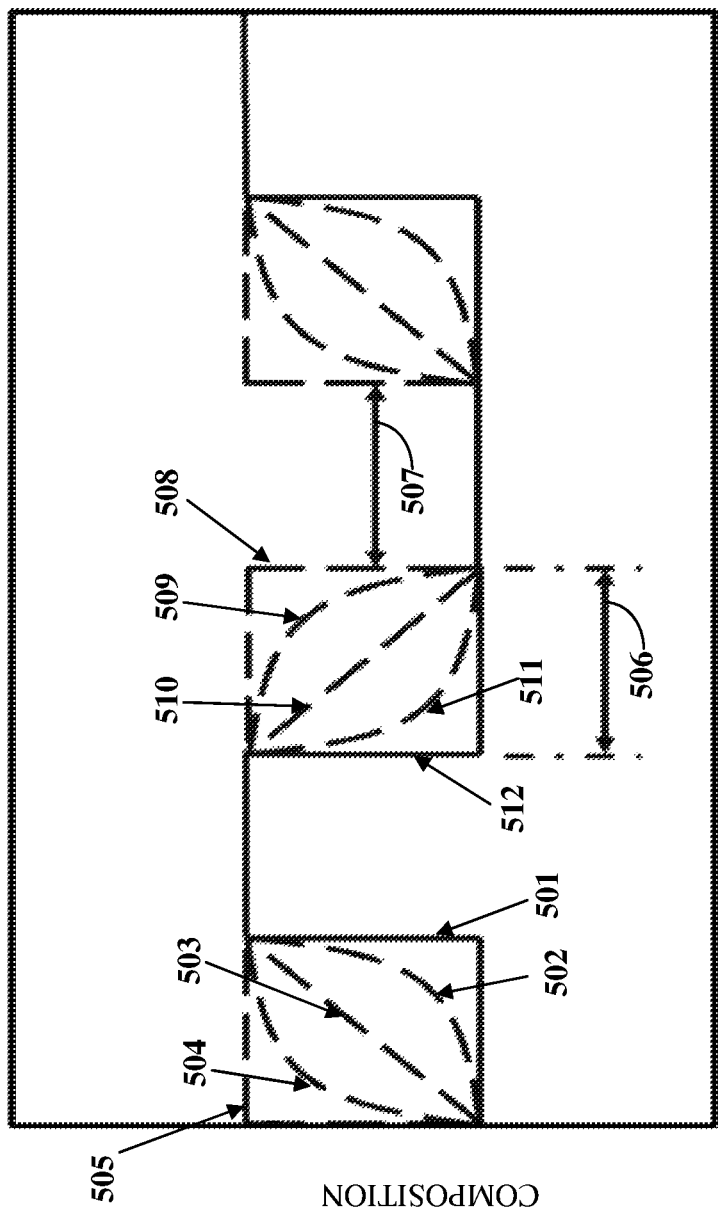
FIG. 5 illustrates exemplary profiles of the distribution in the composition of the device intermediate layer of the defect mitigation structure.

FIG. 5 illustrates exemplary profiles of the distribution in the composition of the device intermediate layer 102e of the defect mitigation structure 102 from the bottom to the top. FIG. 5 shows a distribution in device intermediate layer composition along a thickness coordinate. In an embodiment, the distribution in the device intermediate layer composition is based on the distribution of a single ingredient in the device intermediate layer composition. For example, if the device active layer 103 is gallium nitride (GaN)-based, the device intermediate layer 102e comprises, for example, AlGaN and the composition distribution presented in FIG. 5 may be based on the distribution of aluminum (Al). Typically, the composition distribution has a variable composition region 506 and a constant composition region 507. The number of variable-constant composition pairs 506 and 507 may be different. For example, the composition distribution comprises one variable-constant composition pair 506 and 507, or 5 variable-constant composition pairs 506 and 507. FIG. 5 shows three variable-constant composition pairs, although only one such pair—the pair in the middle—is labeled with the reference numbers 506 and 507. The thickness of each region 506 or 507 may vary independently. The total number of the variable-constant composition pairs 506 and 507 may also vary independently. As an example, in the first pair of variable-constant composition regions 506 and 507, each has a thickness of about 100 nm and about 200 nm respectively; in the second pair of variable-constant composition regions 506 and 507, each has a thickness of about 200 nm and about 0 nm respectively; and in the third pair of variable-constant composition regions 506 and 507, each has a thickness of about 150 nm and about 50 nm respectively, and so on.

The compositions of the various constant composition regions 507 may not be correlated. For example, the first constant composition region 507 has an ingredient percentage of about 10% aluminum (Al), the second constant composition region 507 has about 3% aluminum (Al), and the third constant composition region 507 has about 8% aluminum (Al), and so on. In an embodiment, the method and the semiconductor device 100 disclosed herein employ different schemes by which the composition changes in the variable composition region 506. Label 501 depicts a scheme in which the composition remains constant for a certain thickness, for example, for the width of the region 506, and increases abruptly to another constant composition value. Label 502 depicts a scheme where the composition is raised at an increasing or exponential rate until the composition reaches a constant value. Label 503 depicts a scheme where the composition increases linearly to a constant value. Label 504 represents a scheme where the composition increases at a diminishing rate until the composition reaches a constant value. Label 505 shows a scheme where the composition jumps abruptly to a constant value. The schemes, for example, 501, 502, 503, 504, and 505 of composition changes in each set of variable-constant composition pairs 506 and 507 are independent. For example, the first variable composition region 506 follows the scheme 501, the second variable composition region 506 follows the scheme 502, and the third variable composition region 506 follows the scheme 503, and so on.

The techniques for targeting the distribution of the compositions in the variable composition regions 506 of the device intermediate layer 102e comprise, for example, controlling the ratio of precursors used for growing the variable composition regions 506, the hardware configuration of the growth chambers, as well as the film growth conditions, for example, temperature and pressure. For example, in order to achieve an abrupt change in the composition, the mass flow controller (MFC) that controls the flow rate of a particular component of the composition to be altered can be closed or opened abruptly. Similarly, in order to achieve a continuous increase in the composition value, either at a constant rate or changing rates, the mass flow controller can be opened or closed gradually in a pre-programmed fashion.

In another embodiment, the method and the semiconductor device 100 disclosed herein employ different schemes by which the composition value of the device intermediate layer 102e decreases in the variable composition region 506. Label 508 depicts a scheme in which the composition remains constant for a certain thickness, for example, for the width of 506 and decreases abruptly to another constant composition value. Label 509 shows a scheme where the composition is reduced at an increasing rate until the composition reaches a constant value. Label 510 shows a scheme where the composition decreases linearly to a constant value. Label 511 shows a scheme where the composition decreases at a diminishing rate until the composition reaches a constant value. Label 512 shows a scheme where the composition drops abruptly to a constant value.

In the case of gallium nitride (GaN) devices, an example of the variation of the composition in the device intermediate layer 102e can be found in the $Al_xGa_{1-x}N$ system. In the $Al_xGa_{1-x}N$ system, the first constant composition can be, for example, about a 0.1 μm thick $Al_{0.1}Ga_{0.9}N$, which changes abruptly to a 0.5 μm thick GaN, before changing abruptly to another (0.1 μm $Al_{0.1}Ga_{0.9}N$)/(0.5 μm GaN) cycle, and finally returns abruptly to a 0.1 μm $Al_{0.1}Ga_{0.9}N$. In growing the device intermediate layer 102e based on AlGaN, the mass flow controller controlling the aluminum (Al) precursor has to be switched from a predefined value to zero at different points of growth.

Typically, each constant composition region 507 has constant physical parameters, for example, lattice parameters, coefficient of thermal expansion (CTE), thermal conductivity, and electrical conductivity. However, each variable composition region 506 has at least one of these parameters changing across the thickness of that variable composition region 506. The degree of change in the physical parameters of the variable composition regions 506 is not correlated. Typically, the defect density in the variable composition regions 506 is higher than the constant composition regions 507. There may also be high defect densities at the interface between regions with different compositions.

Figure 6:
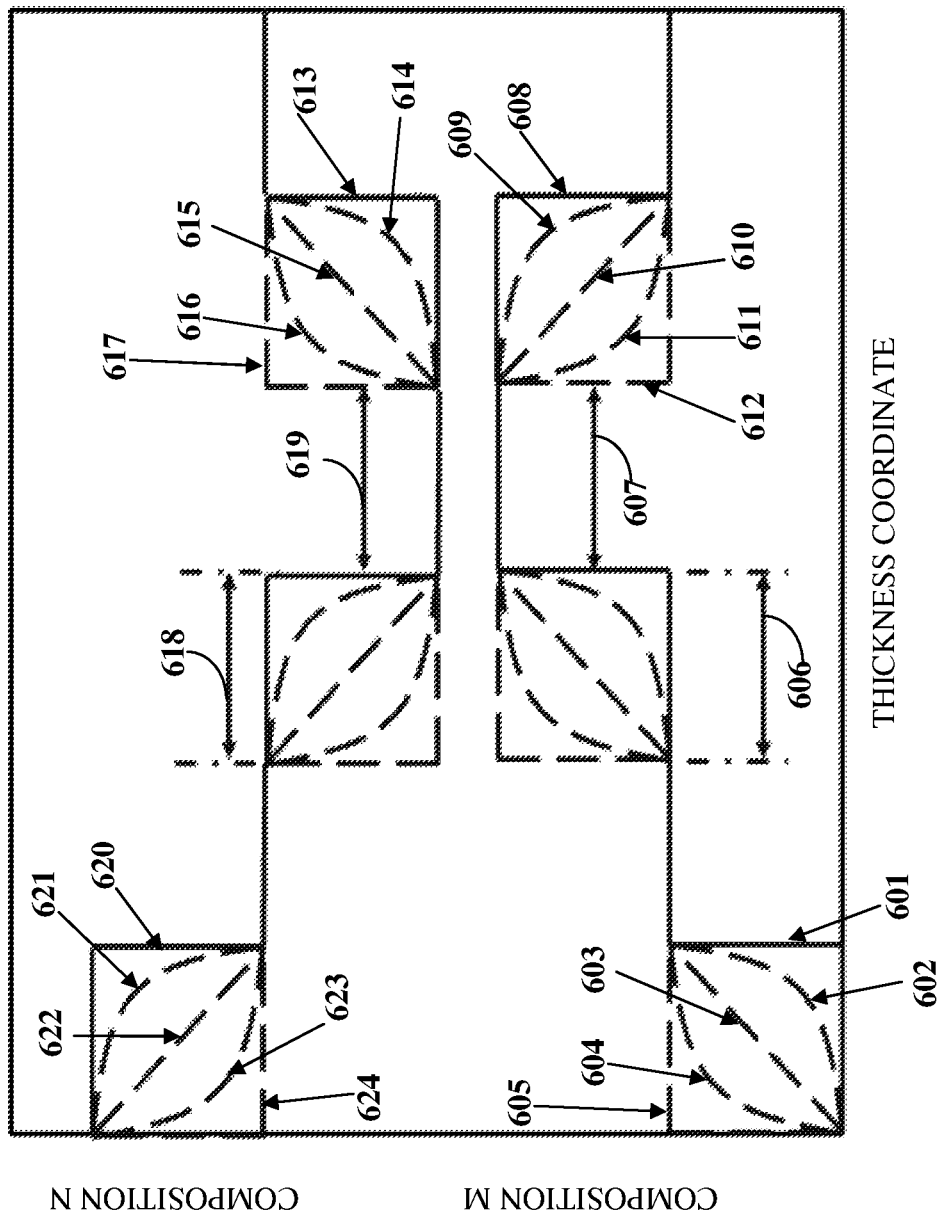
FIG. 6 illustrates exemplary profiles of the distribution in the composition of the device intermediate layer of the defect mitigation structure, where the distribution in the device intermediate layer composition is based on the distribution of more than one ingredient in the device intermediate layer composition.

FIG. 6 illustrates exemplary profiles of the distribution in the composition of the device intermediate layer 102e of the defect mitigation structure 102, where the distribution in the device intermediate layer composition is based on the distribution of more than one ingredient in the device intermediate layer composition from the bottom to the top. In the case where the device active layer 103 is gallium nitride (GaN)-based, the device intermediate layer 102e may be a ternary or quaternary compound, for example, AlInGaN, and the composition M represented in FIG. 6 may be based on the distribution of aluminum (Al), whereas the composition N may be based on the distribution of indium (In). The composition M typically has a variable composition region 606 and a constant composition region 607. The number of variable-constant composition pairs 606 and 607 may be different. For example, the composition distribution comprises one variable-constant composition pair 606 and 607 or 5 variable-constant composition pairs 606 and 607. FIG. 6 shows three variable-constant composition pairs for composition M, although only one such pair—the pair in the middle—is labeled with the reference numbers 606 and 607. The thickness of each region 606 or 607 can vary independently. The total number of the variable-constant composition pairs 606 and 607 can also vary independently. As an example, in the first pair of variable-constant composition regions 606 and 607, each has a thickness of about 100 nm and about 200 nm respectively; in the second pair of variable-constant composition regions 606 and 607, each has a thickness of about 200 nm and about 0 nm respectively; and in the third pair of variable-constant composition regions 606 and 607, each has a thickness of about 150 nm and about 50 nm respectively, and so on.

The compositions of the constant composition regions 607 may not be correlated in composition M. For example, the first constant composition region 607 has an ingredient percentage of about 10% aluminum (Al), the second constant composition region 607 has about 20% aluminum (Al), and the third constant composition region 607 has about 9% aluminum (Al), and so on. In an embodiment, the method and the semiconductor device 100 disclosed herein employ different schemes by which the composition is increased in the variable composition region 606 of composition M. Label 601 depicts a scheme in which the composition remains constant for a certain thickness, for example, for the width of 606 and increases abruptly to another constant composition value. Label 602 shows a scheme where the composition is raised at an increasing or exponential rate until the composition reaches a constant value. Label 603 shows a scheme where the composition increases linearly to a constant value. Label 604 shows a scheme where the composition increases at a diminishing rate until the composition reaches a constant value. Label 605 shows a scheme where the composition jumps abruptly to a constant value.

In another embodiment, the method and the semiconductor device 100 disclosed herein employ different schemes by which the composition value of the device intermediate layer 102e decreases in the variable composition region 606 of composition M. Label 608 depicts a scheme in which the composition remains constant for a certain thickness, for example, the width of 606 and decreases abruptly to another constant composition value. Label 609 shows a scheme where the composition is reduced at an increasing rate until the composition reaches a constant value. Label 610 shows a scheme where the composition decreases linearly to a constant value. Label 611 shows a scheme where the composition decreases at a diminishing rate until the composition reaches a constant value. Label 612 shows a scheme where the composition drops abruptly to a constant value. The schemes, for example, 601, 602, 603, 604, 605, 608, 609, 610, 611, and 612 for composition changes in each set of variable-constant composition pair 606 and 607 of composition M are independent. For example, the first variable composition region 606 follows the scheme 601, the second variable composition region 606 follows the scheme 602, and the third variable composition region 606 follows the scheme 603, and so on.

Similar to composition M, composition N typically has a variable composition region 618 and a constant composition region 619. The number of variable-constant composition pairs 618 and 619 may be different. For example, the composition distribution comprises one variable-constant composition pair 618 and 619, or 5 variable-constant composition pairs 618 and 619. FIG. 6 shows three variable-constant composition pairs for composition N, although only one such pair—the pair in the middle—is labeled with the reference numbers 618 and 619. The thickness of each region 618 or 619 can vary independently. The total number of the variable-constant composition pairs 618 and 619 can also vary independently. As an example, in the first pair of variable-constant composition regions 618 and 619, each has a thickness of about 100 nm and about 200 nm respectively; in the second pair of variable-constant composition regions 618 and 619, each has a thickness of about 200 nm and about 0 nm respectively; and in the third pair of variable-constant composition regions 618 and 619, each has a thickness of about 150 nm and about 50 nm respectively, and so on.

The compositions of the constant composition regions 619 may not be correlated in composition N. For example, the first constant composition region 619 comprises about 30% indium (In), the second constant composition region 619 comprises about 20% indium (In), and the third constant composition region 619 comprises about 25% indium (In), and so on. In an embodiment, the method and the semiconductor device 100 disclosed herein employ different schemes by which the composition increases in the variable composition region 618 of composition N. For example, label 613 depicts a scheme in which the composition remains constant for a certain thickness, for example, for the width of 618 and increases abruptly to another constant composition value. Label 614 shows a scheme where the composition is raised at an increasing or exponential rate until the composition reaches a constant value. Label 615 shows a scheme where the composition increases linearly to a constant value. Label 616 shows a scheme where the composition increases at a diminishing rate until the composition reaches a constant value. Label 617 shows a scheme where the composition jumps abruptly to a constant value.

In another embodiment, the method and the semiconductor device 100 disclosed herein employ different schemes by which the composition value of the device intermediate layer 102e decreases in the variable composition region 618 of composition N. For example, label 620 depicts a scheme in which the composition remains constant for a certain thickness, for example, for the width of 618 and decreases abruptly to another constant composition value. Label 621 shows a scheme where the composition is reduced at an increasing rate until the composition reaches a constant value. Label 622 shows a scheme where the composition decreases linearly to a constant value. Label 623 shows a scheme where the composition decreases at a diminishing rate until the composition reaches a constant value. Label 624 shows a scheme where the composition drops abruptly to a constant value. The schemes, for example, 613, 614, 615, 616, 617, 620, 621, 622, 623, and 624 for composition changes in each set of variable-constant composition pairs 618 and 619 of composition N are independent. For example, the first variable composition region 618 follows the scheme 613, the second variable composition region 618 follows the scheme 614, and the third variable composition region 618 follows the scheme 615, and so on.

The changes in compositions M and N may or may not be correlated. Consider, for example, that composition M is based on the distribution of aluminum (Al), and composition N is based on the distribution of indium (In) in AlInGaN. The distributions of aluminum (Al) and indium (In) are fully independent but are bound together with Ga such that the number of Al, In, and Ga atoms in the formula is 1. However, in cases where composition N represents a dopant, for example, Si, Mg or Ge in the AlGaN system, the distribution of the dopants are fully independent. Also, the regions where changes in composition M and composition N occur may or may not be correlated. For example, composition M varies in a certain region while composition N remains a constant in that region, and vice versa in another region. The thickness of each set of variable-constant composition pairs in composition M and composition N may or may not be the same. For example, the first variable composition region 606 of composition M has a thickness of about 200 nm, whereas the first variable composition region 618 in composition N has a thickness of about 50 nm, even if the compositions have any overlap in regions 606 and 618.

Typically, physical parameters, for example, lattice parameters, coefficient of thermal expansion (CTE), thermal conductivity and electrical conductivity of a layer change when at least one of the compositions is varied, and these parameters remain constant only when the compositions of a layer remain unchanged. Typically, each constant composition region 607 or 619 has constant physical parameters, for example, lattice parameters, CTE, thermal conductivity, and electrical conductivity. However, each variable composition region 606 or 618 has at least one of these parameters changing across the thickness of that variable composition region 606 or 618. The degree of change in the physical parameters in the variable composition regions 606 and 618 is not correlated. Typically, the defect density in the variable composition regions 606 and 618 is higher than the constant composition regions 607 and 619. There may also be high defect densities at the interface between regions with different compositions.

Figure 7:
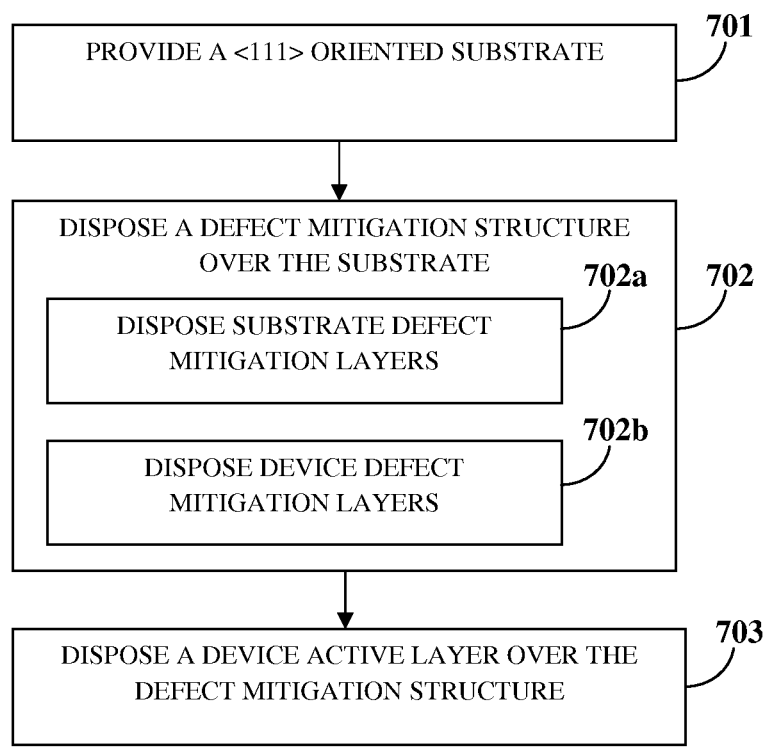
FIG. 7 illustrates a method for fabricating a semiconductor device comprising a defect mitigation structure.

FIG. 7 illustrates a method for fabricating a semiconductor device 100 comprising a defect mitigation structure 102. The method disclosed herein is, for example, used for preparing defect mitigation layer schemes on off-axis Si based substrates 101 for the fabrication of group III nitride devices, for example, devices in the GaN systems. A <111> oriented off axis Si based substrate 101 is provided 701. A substrate wafer preparation step in general involves cleaning the surface of the substrate wafer to remove organic molecules, particles and metal contaminants, and native oxide. The substrate wafer is cleaned with chemicals, for example, sulfuric acid ($H_2SO_4$), hydrogen peroxide ($H_2O_2$), hydrochloric acid (HCl), hydrofluoric acid (HF), ammonium hydroxide ($NH_4OH$), etc. The defect mitigation structure 102 comprising the substrate defect mitigation (DM) layers 102a, 102b, and 102c and the device defect mitigation (DM) layers 102d, 102e, and 102f is disposed 702 over the substrate 101 as exemplarily illustrated in FIGS. 1-2. That is, the substrate defect mitigation (DM) layers 102a, 102b, and 102c comprising, for example, group IV alloys are disposed 702a over the substrate 101. The device defect mitigation (DM) layers 102d, 102e, and 102f are then disposed 702b over the substrate defect mitigation (DM) layers 102a, 102b, and 102c. After the deposition of the device defect mitigation (DM) layers 102d, 102e, and 102f, a device active layer 103, for example, an active GaN film is disposed 703 or grown over the defect mitigation structure 102. The defect mitigation structure 102 is fabricated, for example, by disposing a substrate nucleation layer 102a over the substrate 101, disposing a substrate intermediate layer 102b over the substrate nucleation layer 102a, disposing a substrate top layer 102c over the substrate intermediate layer 102b, disposing a device nucleation layer 102d over the substrate top layer 102c, disposing a device intermediate layer 102e over the device nucleation layer 102d, and disposing a device top layer 102f over the device intermediate layer 102e.

Figure 8A:
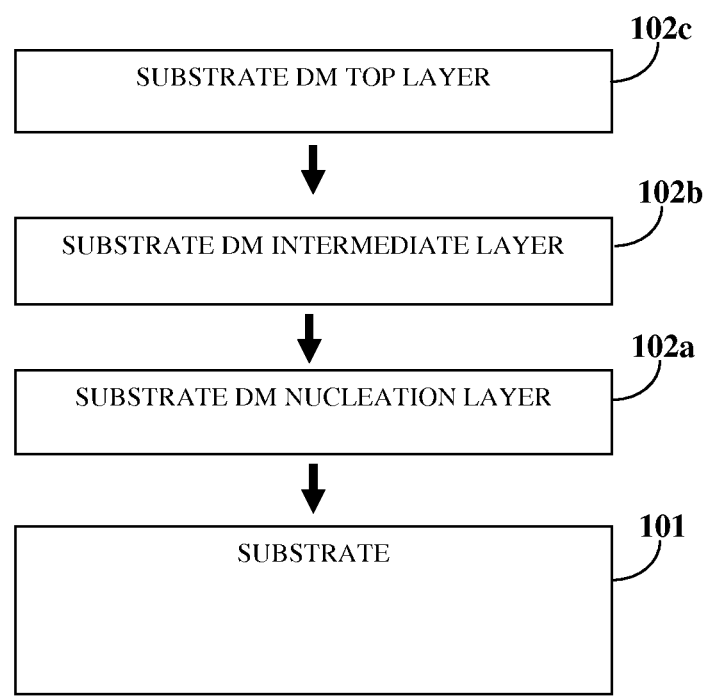
FIG. 8A exemplarily illustrates deposition of substrate defect mitigation layers on the substrate.

FIG. 8A exemplarily illustrates deposition of the substrate defect mitigation layers 102a, 102b, and 102c on the substrate 101. The substrate defect mitigation layers 102a, 102b, and 102c are deposited on an off-axis Si based substrate 101, after preparing the surface of the substrate 101. The substrate defect mitigation (DM) layers 102a, 102b, and 102c comprise a substrate nucleation layer 102a, a substrate intermediate layer 102b, and a substrate top layer 102c as disclosed in the detailed description of FIG. 2. In an example, the substrate intermediate layer 102b is a combination of layers comprising doped or undoped group IV alloys having a formula $Si_{1-x}Ge_xC_y$, where $0 \leq x \leq 1$ and $0 \leq y \leq 1$. Typical techniques suitable for depositing these layers 102a, 102b, and 102c comprise, for example, chemical vapor deposition (CVD) and molecular beam epitaxy (MBE). Typically, before the actual deposition of these films in the equipment, an in-situ cleaning of the surface of the substrate 101 is performed, typically using hydrogen ($H_2$), hydrogen chloride (HCl) or hydrogen fluoride (HF). In an example, the films are deposited at temperatures ranging from about 500° C. to about 1300° C., depending on the composition of these layers 102a, 102b, and 102c. The deposition of the substrate defect mitigation layers 102a, 102b, and 102c may also comprise other process steps between the depositions such as heat treatment and polishing. The substrate defect mitigation layers 102a, 102b, and 102c are derived from different materials, and may also comprise a collection of different materials in each sub-layer structure. The materials of the substrate defect mitigation layers 102a, 102b, and 102c comprise undoped and doped $Si_{1-x}Ge_x$, with "x" being in the range of, for example, 0.23 to 0.8, silicon carbide (SiC), undoped and doped SiGe:C with C being in the range of, for example, 0% to 5%. Typical dopants comprise, for example, boron (B), phosphorous (P), arsenic (As), etc., with dopant concentrations, for example, between $1 \times 10^{13}$ to $1 \times 10^{21}/cm^3$.

Figure 8B:
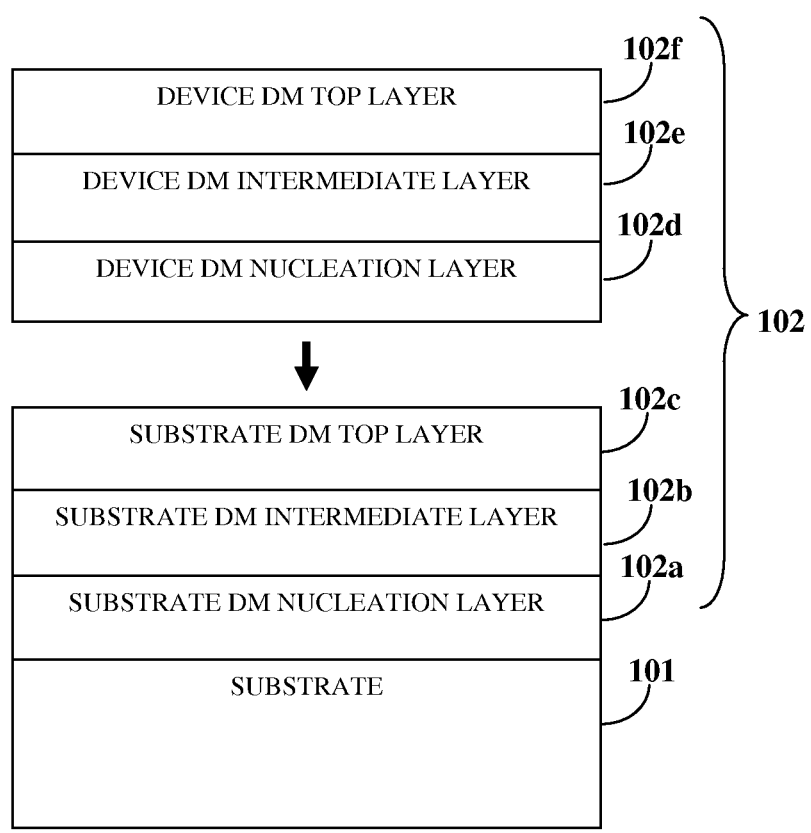
FIG. 8B exemplarily illustrates deposition of device defect mitigation layers on the substrate defect mitigation layers.

FIG. 8B exemplarily illustrates deposition of the device defect mitigation layers 102d, 102e, and 102f on the substrate defect mitigation layers 102a, 102b, and 102c. The device defect mitigation (DM) layers 102d, 102e, and 102f comprise a device nucleation layer 102d, a device intermediate layer 102e, and a device top layer 102f as disclosed in the detailed description of FIG. 2. The device nucleation layer 102d is composed of, for example, metal or non-metal nitride compounds and alloys with lattice hexagonal symmetry or hexagonal symmetry on one of their planes. The device nucleation layer 102d is composed of a metal nitride material with either a hexagonal lattice structure, for example, aluminum nitride (AlN), aluminum gallium nitride (AlGaN), Si—AlN, Si—AlGaN, Ge—AlN, Ge—AlGaN, Mg—AlN, Mg—AlGaN, Ge—AlN, and Ge—AlGaN, or with a hexagonal symmetry on one of its lattice planes, for example, the (111) plane of the body-centered cubic titanium nitride (TiN). The device nucleation layer 102d comprises, for example, one of silicon nitride ($Si_3N_4$), $Ge_3N_4$, $(Si_{1-x}Ge_x)_3N_4$, AlN, TiN, aluminum indium nitride (AlInN), and derivatives thereof. The device intermediate layer 102e is composed of metal nitride compounds and alloys with lattice hexagonal symmetry or hexagonal symmetry on one of their planes. The device intermediate layer 102e comprises, for example, one or more of AlN, TiN, AlInN, AlGaN, AlInGaN, Si—AlN, Si—AlInN, Si—GaN, Si—AlGaN, Si—AlInGaN, Mg—AlN, Mg—AlInN, Mg—GaN, Mg—AlGaN, Mg—AlInGaN, Ge—AlN, Ge—AlInN, Ge—GaN, Ge—AlGaN, Ge—AlInGaN, and derivatives thereof.

Typical techniques suitable for depositing the device defect mitigation (DM) layers 102d, 102e, and 102f comprise, for example, metallorganic chemical vapor deposition (MOCVD), molecular beam epitaxy (MBE), hybrid vapor phase deposition (HVPE), and molecular vapor phase deposition (MOVPE), all of which are known to a person of ordinary skill in the art. The films can be deposited at temperatures ranging, for example, from about 500° C. to about 1300° C., depending on the composition of these layers 102d, 102e, and 102f and the deposition technique used. The deposition of the device defect mitigation layers 102d, 102e, and 102f may also comprise other process steps between the depositions such as heat treatment and polishing. Since the deposition techniques between the substrate defect mitigation layers 102a, 102b, and 102c and the device defect mitigation layers 102d, 102e, and 102f are quite different, there is typically a pause between these depositions. This pause may include exposing the substrate 101 to air. There is typically a cleaning step of the substrate 101 before the deposition, which is performed, for example, using sulfuric acid ($H_2SO4$), hydrogen peroxide ($H_2O_2$), hydrofluoric acid (HF), hydrochloric acid (HCl), ammonium hydroxide ($NH_4OH$), and hydrogen ($H_2$).

Figure 8C:
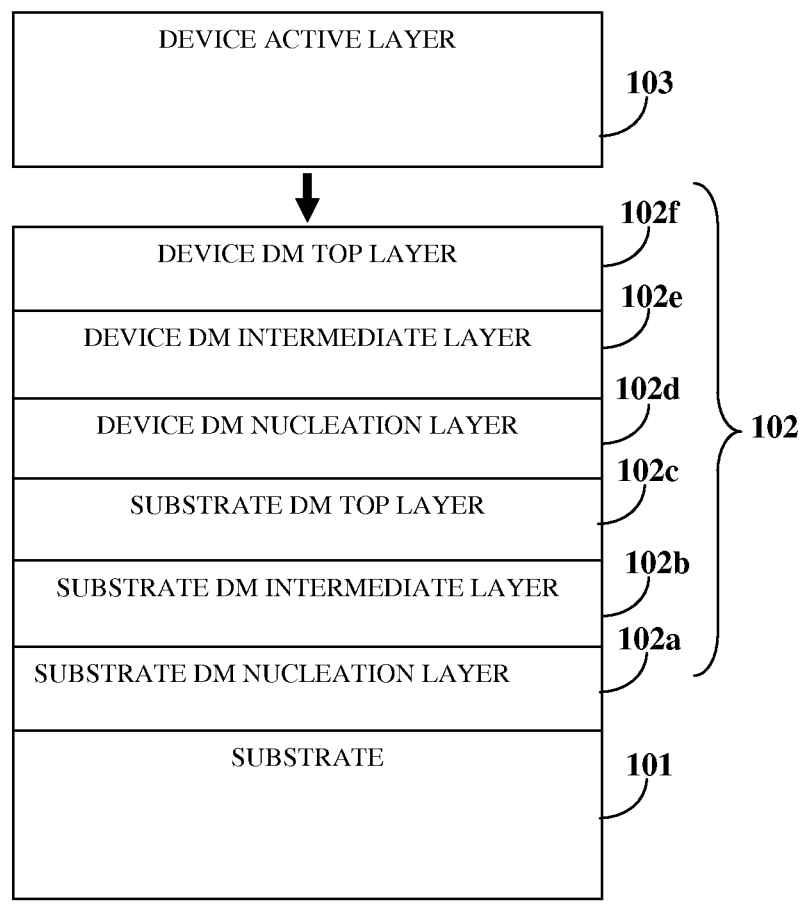
FIG. 8C exemplarily illustrates deposition of a device active layer on the device defect mitigation layers.

FIG. 8C exemplarily illustrates deposition of a device active layer 103 on the device defect mitigation layers 102d, 102e, and 102f. The device active layer 103 comprises a group III nitride material, for example, a GaN based material. Typical techniques suitable for depositing the device active layer 103 comprise, for example, metallorganic chemical vapor deposition (MOCVD), molecular beam epitaxy (MBE), hybrid vapor phase deposition (HVPE), and molecular vapor phase deposition (MOVPE). In an example, the films are deposited at temperatures ranging from about 500° C. to about 1200° C., depending on the composition of the device active layer 103 and the deposition technique used. Since the deposition technique used is the same as those used for the deposition of the device defect mitigation layers 102d, 102e, and 102f, a pause between these depositions or any other additional cleaning or other steps may not be necessitated.

The foregoing examples have been provided merely for the purpose of explanation and are in no way to be construed as limiting of the invention disclosed herein. While the invention has been described with reference to various embodiments, it is understood that the words, which have been used herein, are words of description and illustration, rather than words of limitation. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

We claim:

1. A semiconductor device, comprising:
   a substrate;
   a defect mitigation structure disposed over the substrate, wherein the defect mitigation structure includes:
   a substrate nucleation layer disposed over the substrate;
   a substrate intermediate layer disposed over the substrate nucleation layer;
   a substrate top layer disposed over the substrate intermediate layer;
   a device nucleation layer disposed over the substrate top layer, wherein the device nucleation layer comprises one of $Ge_3N_4$ and $(Si_{1-x}Ge_x)_3N_4$;
   a device intermediate layer disposed over the device nucleation layer, wherein a coefficient of thermal expansion of the device intermediate layer is different from a coefficient of thermal expansion of the device nucleation layer, and wherein lattice parameters of the device intermediate layer are substantially similar to lattice parameters of the device nucleation layer; and
   a device top layer disposed over the device intermediate layer; and
   a device active layer disposed over the defect mitigation structure.

2. The semiconductor device of claim 1, wherein the substrate comprises one of doped silicon, undoped silicon, a derivative of silicon, or a group IV alloy having a formula $Si_{1-x}Ge_xC_y$, where $0 \leq x \leq 1$ and $0 \leq y \leq 1$.

3. The semiconductor device of claim 1, wherein the substrate is <111> oriented, and wherein a macroscopic misorientation angle of the substrate is one of about 0° to about 10° and about 1° to about 5°.

4. The semiconductor device of claim 1, wherein the substrate intermediate layer comprises a distribution in substrate intermediate layer composition along a thickness coordinate, wherein the distribution in the substrate intermediate layer composition is based on one of a distribution of a single ingredient in the substrate intermediate layer composition or a distribution of more than one ingredient in the substrate intermediate layer composition and wherein the device intermediate layer comprises a distribution in device intermediate layer composition along a thickness coordinate, wherein the distribution in the device intermediate layer composition is based on one of a distribution of a single ingredient in the device intermediate layer composition or a distribution of more than one ingredient in the device intermediate layer composition.

5. The semiconductor device of claim 4, wherein the distribution of the single ingredient in the substrate intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

6. The semiconductor device of claim 4, wherein the distribution of the more than one ingredient in the substrate intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

7. The semiconductor device of claim 1, wherein the device intermediate layer comprises one or more of aluminum nitride (AlN), titanium nitride (TiN), aluminum indium nitride (AlInN), aluminum gallium nitride (AlGaN), AlIn- GaN, Si-AlN, Si—AlInN, Si—GaN, Si—AlGaN, Si—AlInGaN, Mg—AlN, Mg—AlInN, Mg—GaN, Mg—AlGaN, Mg—AlInGaN, Ge—AlN, Ge—AlInN, Ge—GaN, Ge—AlGaN, Ge—AlInGaN, or derivatives thereof.

8. The semiconductor device of claim 4, wherein the distribution of the single ingredient in the device intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

9. The semiconductor device of claim 4, wherein the distribution of the more than one ingredient in the device intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

10. The semiconductor device of claim 1, wherein one or more properties of the substrate nucleation layer are substantially similar to one or more properties of the substrate.

11. The semiconductor device of claim 1, wherein the substrate nucleation layer is one of a doped substrate nucleation layer and an undoped substrate nucleation layer, and wherein a dopant for doping the substrate nucleation layer is one of boron, aluminum, phosphorous, or arsenic.

12. The semiconductor device of claim 1, wherein the substrate nucleation layer is characterized by one of substantially similar defect density compared to the substrate or a lower defect density compared to the substrate.

13. The semiconductor device of claim 1, wherein the substrate intermediate layer is one of a doped substrate intermediate layer or an undoped substrate intermediate layer, and wherein a dopant for doping the substrate intermediate layer is one of boron, aluminum, phosphorous, or arsenic.

14. The semiconductor device of claim 1, wherein one or more properties of the substrate intermediate layer are different from one or more properties of the substrate nucleation layer.

15. The semiconductor device of claim 1, wherein a composition of the substrate top layer is substantially similar to a composition of a top surface of the substrate intermediate layer.

16. The semiconductor device of claim 1, wherein the substrate top layer is characterized by a lower defect density compared to the substrate intermediate layer.

17. The semiconductor device of claim 1, wherein the substrate top layer is one of a doped substrate top layer or an undoped substrate top layer, and wherein a dopant for doping the substrate top layer is one of boron, aluminum, phosphorous, or arsenic.

18. The semiconductor device of claim 1, wherein one or more properties of the device nucleation layer are substantially similar to one or more properties of the substrate top layer.

19. The semiconductor device of claim 1, wherein one or more properties of the device nucleation layer are different from one or more properties of the substrate top layer.

20. The semiconductor device of claim 1, wherein the device nucleation layer is characterized by one of a high defect density or a low defect density.

21. The semiconductor device of claim 1, wherein the device intermediate layer is characterized by a lower defect density compared to the device nucleation layer.

22. The semiconductor device of claim 1, wherein a composition of the device top layer matches a composition of the device active layer.

23. The semiconductor device of claim 1, wherein lattice parameters and a coefficient of thermal expansion of the device top layer are different from lattice parameters and a coefficient of thermal expansion of the device intermediate layer.

24. The semiconductor device of claim 1, wherein the device active layer comprises a group III nitride material.

25. The semiconductor device of claim 1, wherein the substrate intermediate layer is a combination of layers comprising doped or undoped group IV alloys having a formula $Si_{1-x}Ge_xC_y$, where $0 \le x \le 1$ and $0 \le y \le 1$.

26. The semiconductor device of claim 1, wherein the device intermediate layer comprises a titanium nitride (TiN).

27. A semiconductor device, comprising:
a substrate;
a defect mitigation structure disposed over the substrate, wherein the defect mitigation structure includes:
a substrate nucleation layer disposed over the substrate;
a substrate intermediate layer disposed over the substrate nucleation layer, wherein the substrate intermediate layer is a combination of layers comprising doped or undoped group IV alloys having a formula $Si_{1-x}Ge_xC_y$, where $0 \le x \le 1$ and $0 \le y \le 1$;
a substrate top layer disposed over the substrate intermediate layer;
a device nucleation layer disposed over the substrate top layer;
a device intermediate layer disposed over the device nucleation layer; and
a device top layer disposed over the device intermediate layer; and
a device active layer disposed over the defect mitigation structure.

28. The semiconductor device of claim 27, wherein the substrate is <111> oriented, and wherein a macroscopic misorientation angle of the substrate is one of about 0° to about 10° and about 1° to about 5°.

29. The semiconductor device of claim 27, wherein the substrate intermediate layer comprises a distribution in substrate intermediate layer composition along a thickness coordinate, wherein the distribution in the substrate intermediate layer composition is based on one of a distribution of a single ingredient in the substrate intermediate layer composition or a distribution of more than one ingredient in the substrate intermediate layer composition and wherein the device intermediate layer comprises a distribution in device intermediate layer composition along a thickness coordinate, and wherein the distribution in the device intermediate layer composition is based on one of a distribution of a single ingredient in the device intermediate layer composition or a distribution of more than one ingredient in the device intermediate layer composition.

30. The semiconductor device of claim 29, wherein the distribution of the single ingredient in the substrate intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

31. The semiconductor device of claim 29, wherein the distribution of the more than one ingredient in the substrate intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

32. The semiconductor device of claim 27, wherein the device nucleation layer comprises one of silicon nitride ($Si_3N_4$), $Ge_3N_4$, $(Si_{1-x}Ge_x)_3N_4$, aluminum nitride (AlN), aluminum indium nitride (AlInN), or derivatives thereof.

33. The semiconductor device of claim 27, wherein the device intermediate layer comprises one or more of aluminum nitride (AlN), titanium nitride (TiN), aluminum indium nitride (AlInN), aluminum gallium nitride (AlGaN), AlInGaN, Si-AlN, Si—AlInN, Si—GaN, Si—AlGaN, Si—AlInGaN, Mg—AlN, Mg—AlInN, Mg—GaN, Mg—AlGaN, Mg—AlInGaN, Ge—AlN, Ge—AlInN, Ge—GaN, Ge—AlGaN, Ge—AlInGaN, or derivatives thereof.

34. The semiconductor device of claim 29, wherein the distribution of the single ingredient in the device intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

35. The semiconductor device of claim 29, wherein the distribution of the more than one ingredient in the device intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

36. The semiconductor device of claim 27, wherein one or more properties of the substrate nucleation layer are substantially similar to one or more properties of the substrate.

37. The semiconductor device of claim 27, wherein the substrate nucleation layer is one of a doped substrate nucleation layer and an undoped substrate nucleation layer, and wherein a dopant for doping the substrate nucleation layer is one of boron, aluminum, phosphorous, or arsenic.

38. The semiconductor device of claim 27, wherein the substrate nucleation layer is characterized by one of substantially similar defect density compared to the substrate or a lower defect density compared to the substrate.

39. The semiconductor device of claim 27, wherein the substrate intermediate layer is one of a doped substrate intermediate layer or an undoped substrate intermediate layer, and wherein a dopant for doping the substrate intermediate layer is one of boron, aluminum, phosphorous, or arsenic.

40. The semiconductor device of claim 27, wherein one or more properties of the substrate intermediate layer are different from one or more properties of the substrate nucleation layer.

41. The semiconductor device of claim 27, wherein a composition of the substrate top layer is substantially similar to a composition of a top surface of the substrate intermediate layer.

42. The semiconductor device of claim 27, wherein the substrate top layer is characterized by a lower defect density compared to the substrate intermediate layer.

43. The semiconductor device of claim 27, wherein the substrate top layer is one of a doped substrate top layer or an undoped substrate top layer, and wherein a dopant for doping the substrate top layer is one of boron, aluminum, phosphorous, or arsenic.

44. The semiconductor device of claim 27, wherein one or more properties of the device nucleation layer are substantially similar to one or more properties of the substrate top layer.

45. The semiconductor device of claim 27, wherein one or more properties of the device nucleation layer are different from one or more properties of the substrate top layer.

46. The semiconductor device of claim 27, wherein the device nucleation layer is characterized by one of a high defect density or a low defect density.

47. The semiconductor device of claim 27, wherein the device intermediate layer is characterized by a lower defect density compared to the device nucleation layer.

48. The semiconductor device of claim 27, wherein a composition of the device top layer matches a composition of the device active layer.

49. The semiconductor device of claim 27, wherein lattice parameters and a coefficient of thermal expansion of the device top layer are different from lattice parameters and a coefficient of thermal expansion of the device intermediate layer.

50. The semiconductor device of claim 27, wherein the device active layer comprises a group III nitride material.

51. The semiconductor device of claim 27, wherein a coefficient of thermal expansion of the device intermediate layer is different from a coefficient of thermal expansion of the device nucleation layer, and wherein lattice parameters of the device intermediate layer are substantially similar to lattice parameters of the device nucleation layer.

52. A semiconductor device, comprising:
   a substrate;
   a defect mitigation structure disposed over the substrate, wherein the defect mitigation structure includes:
      a substrate nucleation layer disposed over the substrate;
      a substrate intermediate layer disposed over the substrate nucleation layer;
      a substrate top layer disposed over the substrate intermediate layer;
      a device nucleation layer disposed over the substrate top layer, wherein the device nucleation layer comprises a titanium nitride (TiN);
      a device intermediate layer disposed over the device nucleation layer; and
      a device top layer disposed over the device intermediate layer; and
   a device active layer disposed over the defect mitigation structure.

53. The semiconductor device of claim 52, wherein the substrate comprises one of doped silicon, undoped silicon, a derivative of silicon, or a group IV alloy having a formula $Si_{1-x}Ge_xC_y$, where $0 \le x \le 1$ and $0 \le y \le 1$.

54. The semiconductor device of claim 52, wherein the substrate is <111> oriented, and wherein a macroscopic misorientation angle of the substrate is one of about 0° to about 10° and about 1° to about 5°.

55. The semiconductor device of claim 52, wherein the substrate intermediate layer comprises a distribution in substrate intermediate layer composition along a thickness coordinate, wherein the distribution in the substrate intermediate layer composition is based on one of a distribution of a single ingredient in the substrate intermediate layer composition or a distribution of more than one ingredient in the substrate intermediate layer composition and wherein the device intermediate layer comprises a distribution in device intermediate layer composition along a thickness coordinate, and wherein the distribution in the device intermediate layer composition is based on one of a distribution of a single ingredient in the device intermediate layer composition or a distribution of more than one ingredient in the device intermediate layer composition.

56. The semiconductor device of claim 55, wherein the distribution of the single ingredient in the substrate intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

57. The semiconductor device of claim 55, wherein the distribution of the more than one ingredient in the substrate intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

58. The semiconductor device of claim 52, wherein the device intermediate layer comprises one or more of aluminum nitride (AlN), titanium nitride (TiN), aluminum indium nitride (AlInN), aluminum gallium nitride (AlGaN), AlInGaN, Si-AlN, Si—AlInN, Si—GaN, Si—AlGaN, Si—AlInGaN, Mg—AlN, Mg—AlInN, Mg—GaN, Mg—AlGaN, Mg—AlInGaN, Ge—AlN, Ge—AlInN, Ge—GaN, Ge—AlGaN, Ge—AlInGaN, or derivatives thereof.

59. The semiconductor device of claim 55, wherein the distribution of the single ingredient in the device intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

60. The semiconductor device of claim 55, wherein the distribution of the more than one ingredient in the device intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

61. The semiconductor device of claim 52, wherein one or more properties of the substrate nucleation layer are substantially similar to one or more properties of the substrate.

62. The semiconductor device of claim 52, wherein the substrate nucleation layer is one of a doped substrate nucleation layer and an undoped substrate nucleation layer, and wherein a dopant for doping the substrate nucleation layer is one of boron, aluminum, phosphorous, or arsenic.

63. The semiconductor device of claim 52, wherein the substrate nucleation layer is characterized by one of substantially similar defect density compared to the substrate or a lower defect density compared to the substrate.

64. The semiconductor device of claim 52, wherein the substrate intermediate layer is one of a doped substrate intermediate layer or an undoped substrate intermediate layer, and wherein a dopant for doping the substrate intermediate layer is one of boron, aluminum, phosphorous, or arsenic.

65. The semiconductor device of claim 52, wherein one or more properties of the substrate intermediate layer are different from one or more properties of the substrate nucleation layer.

66. The semiconductor device of claim 52, wherein a composition of the substrate top layer is substantially similar to a composition of a top surface of the substrate intermediate layer.

67. The semiconductor device of claim 52, wherein the substrate top layer is characterized by a lower defect density compared to the substrate intermediate layer.

68. The semiconductor device of claim 52, wherein the substrate top layer is one of a doped substrate top layer or an undoped substrate top layer, and wherein a dopant for doping the substrate top layer is one of boron, aluminum, phosphorous, or arsenic.

69. The semiconductor device of claim 52, wherein one or more properties of the device nucleation layer are substantially similar to one or more properties of the substrate top layer.

70. The semiconductor device of claim 52, wherein one or more properties of the device nucleation layer are different from one or more properties of the substrate top layer.

71. The semiconductor device of claim 52, wherein the device nucleation layer is characterized by one of a high defect density or a low defect density.

72. The semiconductor device of claim 52, wherein the device intermediate layer is characterized by a lower defect density compared to the device nucleation layer.

73. The semiconductor device of claim 52, wherein a composition of the device top layer matches a composition of the device active layer.

74. The semiconductor device of claim 52, wherein lattice parameters and a coefficient of thermal expansion of the device top layer are different from lattice parameters and a coefficient of thermal expansion of the device intermediate layer.

75. The semiconductor device of claim 52, wherein the device active layer comprises a group III nitride material.

76. A semiconductor device, comprising:
a substrate;
a defect mitigation structure disposed over the substrate, wherein the defect mitigation structure includes:
a substrate nucleation layer disposed over the substrate;
a substrate intermediate layer disposed over the substrate nucleation layer;
a substrate top layer disposed over the substrate intermediate layer;
a device nucleation layer disposed over the substrate top layer;
a device intermediate layer disposed over the device nucleation layer, wherein the device intermediate layer comprises a titanium nitride (TiN); and
a device top layer disposed over the device intermediate layer; and
a device active layer disposed over the defect mitigation structure.

77. The semiconductor device of claim 76, wherein the substrate comprises one of doped silicon, undoped silicon, a derivative of silicon, or a group IV alloy having a formula $Si_{1-x}Ge_xC_y$, where $0 \leq x \leq 1$ and $0 \leq y \leq 1$.

78. The semiconductor device of claim 76, wherein the substrate is <111> oriented, and wherein a macroscopic misorientation angle of the substrate is one of about 0° to about 10° and about 1° to about 5°.

79. The semiconductor device of claim 76, wherein the substrate intermediate layer comprises a distribution in substrate intermediate layer composition along a thickness coordinate, wherein the distribution in the substrate intermediate layer composition is based on one of a distribution of a single ingredient in the substrate intermediate layer composition or a distribution of more than one ingredient in the substrate intermediate layer composition and wherein the device intermediate layer comprises a distribution in device intermediate layer composition along a thickness coordinate, and wherein the distribution in the device intermediate layer composition is based on one of a distribution of a single ingredient in the device intermediate layer composition or a distribution of more than one ingredient in the device intermediate layer composition.

80. The semiconductor device of claim 79, wherein the distribution of the single ingredient in the substrate intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

81. The semiconductor device of claim 79, wherein the distribution of the more than one ingredient in the substrate intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

82. The semiconductor device of claim 76, wherein the device nucleation layer comprises one of silicon nitride ($Si_3N_4$), $Ge_3N_4$, $(Si_{1-x}Ge_x)_3N_4$, aluminum nitride (AlN), aluminum indium nitride (AlInN), or derivatives thereof.

83. The semiconductor device of claim 79, wherein the distribution of the single ingredient in the device intermediate layer comprises an arbitrary number of both variable composition regions and constant composition regions of uncorrelated thicknesses, and wherein the distribution of the single ingredient in each of the variable composition regions changes one of abruptly, at an increasing rate, at a uniform rate, or at a decreasing rate.

84. The semiconductor device of claim 79, wherein the distribution of the more than one ingredient in the device intermediate layer comprises an arbitrary number and positions of both variable composition regions and constant composition regions of uncorrelated thicknesses, and wherein the distribution of the more than one ingredient in each of the variable composition regions changes one of abruptly, at an increasing rate, at a uniform rate, or at a decreasing rate.

85. The semiconductor device of claim 76, wherein one or more properties of the substrate nucleation layer are substantially similar to one or more properties of the substrate.

86. The semiconductor device of claim 76, wherein the substrate nucleation layer is one of a doped substrate nucleation layer and an undoped substrate nucleation layer, and wherein a dopant for doping the substrate nucleation layer is one of boron, aluminum, phosphorous, or arsenic.

87. The semiconductor device of claim 76, wherein the substrate nucleation layer is characterized by one of substantially similar defect density compared to the substrate or a lower defect density compared to the substrate.

88. The semiconductor device of claim 76, wherein the substrate intermediate layer is one of a doped substrate intermediate layer or an undoped substrate intermediate layer, and wherein a dopant for doping the substrate intermediate layer is one of boron, aluminum, phosphorous, or arsenic.

89. The semiconductor device of claim 76, wherein one or more properties of the substrate intermediate layer are different from one or more properties of the substrate nucleation layer.

90. The semiconductor device of claim 76, wherein a composition of the substrate top layer is substantially similar to a composition of a top surface of the substrate intermediate layer.

91. The semiconductor device of claim 76, wherein the substrate top layer is characterized by a lower defect density compared to the substrate intermediate layer.

92. The semiconductor device of claim 76, wherein the substrate top layer is one of a doped substrate top layer or an undoped substrate top layer, and wherein a dopant for doping the substrate top layer is one of boron, aluminum, phosphorous, or arsenic.

93. The semiconductor device of claim 76, wherein one or more properties of the device nucleation layer are substantially similar to one or more properties of the substrate top layer.

94. The semiconductor device of claim 76, wherein one or more properties of the device nucleation layer are different from one or more properties of the substrate top layer.

95. The semiconductor device of claim 76, wherein the device nucleation layer is characterized by one of a high defect density or a low defect density.

96. The semiconductor device of claim 76, wherein the device intermediate layer is characterized by a lower defect density compared to the device nucleation layer.

97. The semiconductor device of claim 76, wherein a composition of the device top layer matches a composition of the device active layer.

98. The semiconductor device of claim 76, wherein lattice parameters and a coefficient of thermal expansion of the device top layer are different from lattice parameters and a coefficient of thermal expansion of the device intermediate layer.

99. The semiconductor device of claim 76, wherein the device active layer comprises a group III nitride material.

100. A semiconductor device, comprising:
 a substrate;
 a defect mitigation structure disposed over the substrate, wherein the defect mitigation structure includes:
  a substrate nucleation layer disposed over the substrate;
  a substrate intermediate layer disposed over the substrate nucleation layer;
  a substrate top layer disposed over the substrate intermediate layer;
  a device nucleation layer disposed over the substrate top layer;
 a device intermediate layer disposed over the device nucleation layer, wherein a coefficient of thermal expansion of the device intermediate layer is different from a coefficient of thermal expansion of the device nucleation layer, and wherein lattice parameters of the device intermediate layer are substantially similar to lattice parameters of the device nucleation layer, wherein at least one of the device nucleation layer and the device intermediate layer comprises a titanium nitride (TiN); and
  a device top layer disposed over the device intermediate layer; and
 a device active layer disposed over the defect mitigation structure.

* * * * *